US010144232B2

(12) United States Patent
Profaca et al.

(10) Patent No.: US 10,144,232 B2
(45) Date of Patent: Dec. 4, 2018

(54) PRINTER HAVING PRINTHEAD EXTENDING AND RETRACTING THROUGH MAINTENANCE MODULE

(71) Applicant: Memjet Technology Ltd., Dublin (IE)

(72) Inventors: Mark Profaca, North Ryde (AU); David Burke, North Ryde (AU); Billy Sy, North Ryde (AU); Gilbert Alemana, North Ryde (AU); Christopher Hibbard, North Ryde (AU); Rommel Balala, North Ryde (AU)

(73) Assignee: Memjet Technology Ltd. (IE)

( * ) Notice: Subject to any disclaimer, the term of this patent is extended or adjusted under 35 U.S.C. 154(b) by 0 days.

(21) Appl. No.: 15/582,998

(22) Filed: May 1, 2017

(65) Prior Publication Data

US 2017/0313080 A1 Nov. 2, 2017

Related U.S. Application Data

(60) Provisional application No. 62/330,779, filed on May 2, 2016, provisional application No. 62/408,629, filed on Oct. 14, 2016.

(51) Int. Cl.
*B41J 25/304* (2006.01)
*B41J 2/165* (2006.01)
(Continued)

(52) U.S. Cl.
CPC ......... *B41J 25/304* (2013.01); *B41J 2/04541* (2013.01); *B41J 2/155* (2013.01);
(Continued)

(58) Field of Classification Search
CPC ................ B41J 2/04541; B41J 2/16505; B41J 2/16535; B41J 2/155; B41J 2/17596; B41J 2/16523; B41J 2/16508; B41J 25/304
See application file for complete search history.

(56) References Cited

U.S. PATENT DOCUMENTS 7,857,419 B2 * 12/2010 Chikamoto .......... B41J 2/16585 347/33
9,233,541 B1 * 1/2016 Cyr ...................... B41J 2/16523
2004/0160472 A1 8/2004 Khalid
2004/0189736 A1 9/2004 Maher
(Continued)

OTHER PUBLICATIONS

ISR and WO for PCT/EP2017/057902 dated Jul. 18, 2017.
ISR and WO for PCT/EP2017/057792 dated Jul. 4, 2017.
ISR and WO for PCT/EP2017/057903 dated Jul. 5, 2017.

*Primary Examiner* — Jason Uhlenhake
(74) *Attorney, Agent, or Firm* — Cooley LLP

(57) ABSTRACT

A printer includes: a media support defining a media feed path; and a pagewide printing unit for printing onto media fed along the media feed path. The printing unit includes: a maintenance chassis fixedly positioned over the media feed path, the maintenance chassis having a maintenance module fixedly mounted thereto; a print bar chassis movably mounted on the maintenance chassis, the print bar chassis including a print module having a printhead; and a lift mechanism for raising and lowering the print bar chassis relative to the maintenance chassis between a maintenance position a printing position. The printhead extends and retracts through a space defined by the maintenance module in the printing and maintenance positions, respectively.

18 Claims, 16 Drawing Sheets

(51) Int. Cl.

| | |
|---|---|
| ***B41J 29/377*** | (2006.01) |
| ***B41J 2/045*** | (2006.01) |
| ***B41J 2/175*** | (2006.01) |
| ***B41J 25/34*** | (2006.01) |
| ***B41J 2/155*** | (2006.01) |
| ***B41J 25/00*** | (2006.01) |

(52) U.S. Cl.

CPC ....... *B41J 2/16505* (2013.01); *B41J 2/16508* (2013.01); *B41J 2/16511* (2013.01); *B41J 2/16535* (2013.01); *B41J 2/16544* (2013.01); *B41J 2/16547* (2013.01); *B41J 2/16585* (2013.01); *B41J 2/17596* (2013.01); *B41J 25/006* (2013.01); *B41J 25/34* (2013.01); *B41J 29/377* (2013.01); *B41J 2002/1655* (2013.01); *B41J 2002/16514* (2013.01); *B41J 2202/05* (2013.01); *H05K 999/99* (2013.01)

(56) References Cited

U.S. PATENT DOCUMENTS

| | | | |
|---|---|---|---|
| 2005/0243127 | A1 | 11/2005 | Higginson |
| 2006/0119657 | A1 | 6/2006 | Berry et al. |
| 2009/0122107 | A1* | 5/2009 | Ray ...................... B41J 2/16547 347/37 |
| 2009/0141084 | A1* | 6/2009 | Kim ......................... B41J 2/155 347/50 |
| 2009/0189945 | A1 | 7/2009 | Sekiyama |
| 2009/0189946 | A1 | 7/2009 | Taira |
| 2009/0295863 | A1 | 12/2009 | Schultz |
| 2011/0043583 | A1 | 2/2011 | Silverbrook et al. |
| 2012/0050403 | A1 | 3/2012 | Inoue |
| 2013/0293627 | A1 | 11/2013 | Ishii |
| 2014/0184675 | A1 | 7/2014 | Tamaki |
| 2014/0210907 | A1 | 7/2014 | Miyazawa |
| 2014/0340445 | A1 | 11/2014 | Achatz et al. |

* cited by examiner

PRINTER HAVING PRINTHEAD EXTENDING AND RETRACTING THROUGH MAINTENANCE MODULE

CROSS-REFERENCE TO RELATED APPLICATIONS

The present application claims the benefit of priority under 35 U.S.C. § 119(e) of U.S. Provisional Application No. 62/330,779, entitled MODULAR PRINTER, filed May 2, 2016 and of U.S. Provisional Application No. 62/408,629, entitled MODULAR PRINTER, filed Oct. 14, 2016, the contents of each of which are hereby incorporated by reference in their entirety for all purposes.

The present application is related to U.S. application Ser. No. 15/582,979, entitled INK DELIVERY SYSTEM FOR SUPPLYING INK TO MULTIPLE PRINTHEADS AT CONSTANT PRESSURE, filed on even date herewith, to U.S. application Ser. No. 15/582,985, entitled INK DELIVERY SYSTEM WITH ROBUST COMPLIANCE, filed on even date herewith, and to U.S. application Ser. No. 15/583,234, entitled INKJET PRINTHEADING HAVING PRINTHEAD CHIPS ATTACHED TO TRUSS STRUCTURE, filed on even date herewith, the contents of each of which are hereby incorporated by reference in their entirety for all purposes.

FIELD OF THE INVENTION

This invention relates to a modular printer. It has been developed for meeting the demands of digital inkjet presses having multiple print modules, which require regular printhead replacement, printhead maintenance, and a reliable supply of power, data and ink to each printhead.

BACKGROUND OF THE INVENTION

Inkjet printers employing Memjet® technology are commercially available for a number of different printing formats, including small-office-home-office ("SOHO") printers, label printers and wideformat printers. Memjet® printers typically comprise one or more stationary inkjet printhead cartridges, which are user-replaceable. For example, a SOHO printer comprises a single user-replaceable multi-colored printhead cartridge, a high-speed label printer comprises a plurality of user-replaceable monochrome printhead cartridges aligned along a media feed direction, and a wideformat printer comprises a plurality of user-replaceable printhead cartridges in a staggered overlapping arrangement so as to span across a wideformat pagewidth.

For commercial web-based printing, different customers have different printing requirements (e.g. print widths, print speed, number of ink colors). It is, therefore, desirable to provide customers with the flexibility to design a printing system that suits their particular needs. A commercial pagewide printing system may be considered as an N×M two-dimensional array of printheads having N overlapping printheads across the media path and M aligned printheads along the media feed direction. Providing customers with the flexibility to select the dimensions and number of printheads in an N×M array in a modular, cost-effective design would provide access to a wider range of commercial digital printing markets that are traditionally served by offset printing systems.

However, web-based printers having multiple inkjet printheads present many design challenges. For printhead maintenance, it is desirable not to break the web of media during maintenance interventions. Typically, this requires lifting the printheads away from the web and sliding a maintenance chassis underneath the printheads so that a maintenance operation (e.g. wiping or capping) can be performed (see, for example, U.S. Pat. No. 8,616,678 the contents of which are incorporated herein by reference). Moreover, curved media feed paths are preferable for controlling web tension in web-based printing with printheads arranged radially around the media path. A modular and scalable web-based printing system must address the design challenges of maintaining each printhead in the array.

Staggered overlapping arrangements of stationary printheads across the width of a media feed path require minimizing the length of the print zone in the media feed direction in order to minimize print artifacts from overlapping printheads. The competing requirements of maintaining each printhead and minimizing the length of the print zone necessitate compact maintenance arrangements.

Inkjet printheads have a finite lifetime and require regular replacement in a web-based printer. It is desirable to simplify the replacement of printheads in order to minimize downtime in a digital press.

For scalability, it is desirable for each printhead to be replaceably housed in a self-contained module, which supplies ink, power and data to the printhead. Each module should be as compact as possible so that the modules can be stacked in an overlapping arrangement without affecting the length of the print zone in the media feed direction. Moreover, heat-generating electronic components need to be cooled and protected from ink mist.

SUMMARY OF THE INVENTION

In a first aspect, there is provided a printer comprising:

a media support defining a media feed path; and a pagewide printing unit for printing onto media fed along the media feed path, the printing unit comprising:

- a maintenance chassis fixedly positioned over the media feed path, the maintenance chassis having a maintenance module fixedly mounted thereto;

a print bar chassis movably mounted on the maintenance chassis, the print bar chassis comprising a print module having a printhead; and a lift mechanism for raising and lowering the print bar chassis relative to the maintenance chassis between a maintenance position a printing position, wherein the printhead extends and retracts through a space defined by the maintenance module in the printing and maintenance positions, respectively.

The printer according to the first aspect advantageously positions the print bar chassis on a fixed maintenance chassis. This arrangement minimizes the required movement of the print bar chassis and maintenance components during printhead maintenance, minimizing the footprint of the printer and obviating the requirement for aligning bulky print bar and maintenance chassis with each maintenance intervention. In addition, this arrangement is suitable for curved media feed paths because the movement of the print bar chassis is relative to the maintenance chassis, which is itself fixedly positioned over the media feed path. Furthermore, each printing unit is self-contained enabling customers to design a printing system by selecting the number of printing units required.

Preferably, the print bar chassis comprises a plurality of print modules in a staggered overlapping arrangement across a width of the media path and the maintenance chassis comprises a corresponding plurality of maintenance modules, each maintenance module maintaining a respective printhead.

Preferably, the media feed path is generally arcuate, which is preferred for optimizing web tension during printing. As used herein, the term "generally arcuate" includes media feed paths which approximate an arcuate path, but are not arcuate in a strict mathematical sense. For example, a web may be tensioned over a plurality of rollers arranged arcuately. However, between neighboring pairs of rollers, the taught web will be configured as a plurality of straight flat sections, which generally define an arcuate path. It will be appreciated that such arrangements are within the ambit of the term "generally arcuate".

Preferably, each print bar chassis is radially liftable with respect to the generally arcuate media feed path.

In one embodiment, a portion of the maintenance chassis defines a datum for the print bar chassis in the printing position. For example, the print bar chassis may be seated on an upper surface of the maintenance chassis in the printing position. In an alternative embodiment, the print bar chassis may be datumed against part of the media support.

Preferably, each maintenance module comprises a fixed frame defining the opening, the frame housing one or more movable maintenance components.

Preferably, a footprint of each printing unit in both the printing and maintenance positions is defined by a perimeter of the maintenance chassis.

Preferably, the frame is L-shaped having a longer leg and a shorter leg, wherein the opening is defined by a space partially encompassed by the longer and shorter legs.

Preferably, each maintenance module comprises at least one of: a wiper and a capper.

Preferably, the capper is configured to move laterally with respect to the printhead and parallel with a media feed direction.

Preferably, the wiper is configured to move longitudinally with respect to the printhead and perpendicular to a media feed direction.

Preferably, wipers of neighboring printheads are configured to move in opposite longitudinal directions.

Preferably, each print module is slidably received in a sleeve fixed to the print bar chassis.

Preferably, each print module comprises a supply module and a replaceable printhead cartridge, the printhead cartridge comprising the printhead.

Preferably, the supply module houses at least one PCB having a printer controller chip for controlling a respective printhead.

Preferably, the supply module comprises an ink inlet module and an ink outlet module for supplying ink to and receiving ink from the printhead cartridge.

In a related aspect, there is provided a method of maintaining a plurality of printheads:

providing a maintenance chassis positioned over a media feed path in a fixed relationship relative to a media support, the maintenance chassis comprising a plurality of maintenance modules;

providing a print bar chassis positioned on the maintenance chassis, the print bar chassis supporting the plurality of printheads, each printhead having a respective maintenance module and each printhead extending through an opening defined by its respective maintenance module;

lifting the print bar chassis relative to the maintenance chassis from a printing position to a maintenance position, such that each printhead is retracted from each opening; and moving a capper or a wiper of each maintenance module into engagement with a respective printhead.

In another related aspect, there is also provided a pagewide printing unit for mounting over a media feed path and printing onto media, the printing unit comprising:

a maintenance chassis for fixedly mounting over the media feed path, the maintenance chassis having a maintenance module fixedly mounted thereto;

a print bar chassis movably mounted on the maintenance chassis, the print bar chassis comprising a print module having a printhead; and a lift mechanism for raising and lowering the print bar chassis relative to the maintenance chassis between a maintenance position a printing position, wherein, in the printing position, the printhead extends through a space defined by the maintenance module.

In a second aspect, there is provided a printer comprising:

a print module having a printhead for printing onto media fed along a media feed path; and a maintenance module for maintaining the printhead, the maintenance module comprising an L-shaped frame having a longer arm extending parallel with a longitudinal axis of the printhead and a shorter arm, wherein:

the longer arm includes a capper for capping the printhead; and the shorter arm includes a wiper for wiping the printhead.

Advantageously, the L-shaped maintenance module provides a compact means of arranging and tessellating print modules and maintenance modules. By virtue of the compact modular design of maintenance modules, the printing units described above can be readily manufactured with any number of print modules. Further, by having a respective maintenance module for each printhead, printhead maintenance operations may be performed synchronously for an entire printing unit comprised of multiple print modules.

Preferably, the printer comprises a plurality of liftable print modules, each print module comprising a respective printhead.

Preferably, each L-shaped maintenance module is partially wrapped around a respective print module.

Preferably, the printheads are positioned in a staggered overlapping arrangement across a width of the media feed path.

Preferably, the printer comprises a plurality of printheads aligned in a row across the media feed path, wherein the L-shaped maintenance module for a first printhead in the row has its shorter arm interposed between the first printhead and a second adjacent printhead in the row.

Preferably, the printer comprises an upstream printhead positioned upstream of a downstream printhead relative to the media feed direction, wherein a first L-shaped maintenance module for the upstream printhead is rotated by 180 degrees relative to a second L-shaped maintenance module for the downstream printhead.

Preferably, the first and second L-shaped maintenance modules are identical to each other.

Preferably, the upstream and downstream printheads are relatively proximal each other.

Preferably, first and second cappers of the first and second L-shaped maintenance modules are positioned at opposite upstream and downstream sides of respective upstream and downstream printheads, and wherein the first and second cappers move in opposite directions towards their respective upstream and downstream printheads during capping.

Preferably, first and second wipers of the first and second L-shaped maintenance modules are positioned at opposite longitudinal ends of respective first and second printheads, and wherein the first and second wipers move in opposite longitudinal directions long their respective first and second printheads during wiping.

Preferably, the first and second wipers are identical and comprise a web of wiping material having first and second wiping regions across its width, the first wiping region wiping the first printhead and the second wiping region wiping the second printhead.

Preferably, the capper is connected to a longer sidewall of the L-shaped frame via a plurality of connecting arms, the capper extending parallel with the longer sidewall and wherein the connecting arms move the capper laterally relative to the longer sidewall.

In a related aspect, there is provided a method of wiping an array of printheads positioned in a staggered overlapping arrangement across a media feed path, the method comprising the steps of:

providing a respective maintenance module for each printhead, each maintenance module comprising a wiper for wiping longitudinally along a respective printhead in a direction perpendicular to a media feed direction; and wiping one or more printheads in the array, wherein the wipers for neighboring overlapping printheads in the array wipe their respective printheads in opposite longitudinal directions.

In another related aspect, there is provided a maintenance module for maintaining a printhead, the maintenance module comprising an L-shaped frame having a longer arm and a shorter arm, wherein:

the longer arm includes a capper for capping the printhead; and the shorter arm includes a wiper for wiping the printhead.

Preferably, the capper is connected to a longer side plate of the L-shaped frame via a plurality of connecting arms, the capper extending parallel with the longer side plate, and wherein the connecting arms move the capper laterally relative to the longer side plate.

Preferably, the capper is laterally extendable to a capping position distal from the longer side plate, and retractable to a parked position proximal the longer side plate.

the wiper comprises a wiper carriage, the wiper carriage being movable longitudinally and parallel with the longer arm of the L-shaped frame.

Preferably, the wiper carriage comprises a web of wiping material for wiping the printhead.

Preferably, the wiper carriage is connected to the longer side plate of the L-shaped frame via at least one overhead arm slidably received in a guide rail of the longer side plate.

Preferably, the overhead arm bridges over the capper during wiping of the printhead.

In a third aspect, there is provided a print module comprising a printhead cartridge engaged with a supply module, wherein the supply module comprises:

a body housing electronic circuitry for supplying power and data to a printhead of the printhead cartridge; and an ink inlet module and an ink outlet module flanking the body at opposite sides thereof, each of the ink inlet and ink outlet modules having a respective ink coupling engaged with complementary inlet and outlet couplings of the printhead cartridge.

The print module according to the third aspect advantageously enables facile removal and replacement of the printhead cartridge.

Preferably, the ink inlet and outlet modules are slidably movable relative to the body towards and away from the printhead cartridge for coupling and decoupling the supply module and the printhead cartridge.

Preferably, the supply module comprises one or more locating pins extending perpendicularly with respect to a sliding movement direction of the ink inlet and outlet modules, each locating pin being receivable in a respective alignment opening of the printhead cartridge.

Preferably, the locating pins extend from a clamp plate, the clamp plate comprising a longitudinal row of electrical contacts for supplying the power and data to the printhead.

Preferably, the supply module further comprises a movable clamp (e.g. hinged clamp) for clamping the printhead cartridge against the clamp plate.

Preferably, the clamp comprises fasteners for releasably fastening the clamp to the locating pins and thereby securing the printhead cartridge to the supply module.

Preferably, the ink inlet module has an inlet port for receiving ink from an ink reservoir, and the ink outlet module has as outlet port for returning ink to the ink reservoir.

Preferably, the ink inlet module and the ink outlet module house one or more components independently selected from the group consisting of: a control valve for controlling an ink pressure in the printhead cartridge; an ink pressure sensor; a controller for receiving feedback from the ink pressure sensor and controlling the control valve; an air inlet; an air valve connected to the air inlet; a stop valve; a flow restrictor; and a compliance for dampening ink pressure fluctuations.

Preferably, the electronic circuitry comprises one or more printed circuit boards having at least one of:

a microprocessor for supplying print data to a printhead supported by the printhead cartridge; and a drive transistor for powering a printhead supported by the printhead cartridge.

Preferably, the supply module comprises electrical contacts for electrically connecting with complementary electrical contacts on the printhead cartridge.

In a related aspect, there is provided a modular printer comprising a plurality of print modules as described above, wherein each print module is connected to a common ink reservoir.

In a related aspect, there is provided a supply module for a replaceable printhead cartridge, the supply module comprising:

a body housing electronic circuitry for supplying power and data to a printhead of the printhead cartridge; and an ink inlet module and an ink outlet module flanking the body at opposite sides thereof, each of the ink inlet and ink outlet modules having a respective ink coupling engaged with complementary inlet and outlet couplings of the printhead cartridge.

Preferred aspects of the print module are, of course, equally applicable to the supply module, where relevant.

In a related aspect, there is provided a method of coupling a printhead cartridge with a supply module, the supply module comprising a body housing electronic circuitry for supplying power and data signals to the printhead cartridge; and an ink inlet module and an ink outlet module flanking either side of the body, each of the ink inlet and outlet modules having a respective ink coupling, the method comprising the steps of:

positioning the printhead cartridge relative to the supply module so as to align the ink inlet and ink outlet couplings of the supply module with complementary inlet and outlet couplings at each end of the printhead cartridge;

sliding the ink inlet module relative to the body so as to engage the ink coupling of the ink inlet module with the complementary inlet coupling of the printhead cartridge; and sliding the ink outlet module relative to the body so as to engage the ink coupling of the ink outlet module with the complementary outlet coupling of the printhead cartridge.

Preferably, the positioning step comprises moving the printhead cartridge towards the supply module, such that alignment openings in the printhead cartridge slidably receive locating pins extending from the supply module, wherein the locating pins extend in a direction perpendicular to a sliding direction of the ink inlet and outlet modules.

Preferably, the method further comprises the step of moving a clamp against the printhead cartridge and clamping the printhead cartridge against a clamp plate, the locating pins extending from the clamp plate.

Preferably, the method further comprises the step of fastening the clamp against the locating pins to secure the printhead cartridge in an aligned position.

In a fourth aspect, there is provided a print module comprising:

a body housing first and second opposed printed circuit boards (PCBs), each of the first and second PCBs having heat-generating electronic components;

an air inlet and an air outlet positioned towards an upper part of the body;

an air pathway extending between the air inlet and the air outlet;

a plurality of heatsinks, each heatsink being thermally coupled with one of the heat-generating components and having an array of cooling fins extending into the air pathway; and an inkjet printhead receiving power and print data from at least one of the first and second PCBs, wherein the inkjet printhead is positioned toward a lower part of the print module.

The print module according to the fourth aspect advantageously provides a compact arrangement of PCBs, which enjoy cooling from relatively clean, cool air via an air inlet which is relatively distal from the printhead.

Preferably, a direction of ink droplet ejection is opposite to a direction of airflow through the air outlet.

Preferably, the heat-generating electronic components are mounted on opposed surfaces of the first and second PCBs.

Preferably, each heatsink comprises a base in thermal contact with one of the heat-generating electronic components, and wherein the array of cooling fins for each heatsink extends from the base into the air pathway.

Preferably, a first heatsink comprises a first base in thermal contact with a first heat-generating electronic component of the first PCB and first cooling fins extending from the first base into the air pathway; and a second heatsink comprises a second base in thermal contact with a second heat-generating electronic component of the second PCB and second cooling fins extending from the second base into the air pathway, wherein the first and second cooling fins extend from their respective first and second heatsink bases in opposite directions.

Preferably, the air pathway is defined by an air duct extending between air inlet and the air outlet.

Preferably, the air duct isolates the air pathway from the first and second PCBs.

Preferably, the air duct includes a constriction for dividing an airflow through the air inlet into first and second airflows for cooling the first and second arrays of cooling fins, respectively.

Preferably, the air duct has at least one aperture defined in each side thereof, each heatsink being at least partially received in a complementary respective opening.

Preferably, the print module further comprises a fan for generating an airflow through the air pathway.

Preferably, the fan is positioned at the air inlet or the air outlet.

Preferably, the first PCB is a power PCB comprising one or more drive transistors supplying power to the inkjet printhead.

Preferably, the second PCB is a logic PCB comprising one or microprocessors supplying print data to the inkjet printhead.

Preferably, the first and second PCBs are connected via one or more electrical connectors.

Preferably, the print module comprises a supply module engaged with a replaceable printhead cartridge, the supply module comprising the body and the printhead cartridge comprising the inkjet printhead.

In a fifth aspect, there is provided a printhead capping system comprising:

a fixed plate;

first and second sliders slidably movable along the fixed plate;

a mounting bracket having a capper mounted thereon; and first and second arms interconnecting the mounting bracket and the respective first and second sliders, wherein movement of the first and second sliders towards each other causes lateral movement of the capper away from the fixed plate, and movement of the first and second sliders away from each other causes lateral movement of the capper towards the fixed plate.

The capping system according to the fifth aspect provides stable movement of the capper, which maintains a parallel orientation of the capper with respect to the fixed plate.

Preferably, the first arm has a proximal end hingedly connected to the first slider and an opposite distal end hingedly connected to the mounting bracket, and wherein the second arm has a proximal end hingedly connected to the second slider and an opposite distal end hingedly connected to the mounted bracket.

Preferably, respective distal ends of the first and second arms are interengaged via intermeshed gears.

Preferably, the first and second sliders are each slidably mounted on a guide rod attached to the fixed plate.

Preferably, the capping system further comprises an endless belt tensioned between a pair of pulleys rotatably mounted to the fixed plate, wherein the first slider is engaged with an upper portion of the belt and the second slider is engaged with a lower portion of the belt, such that the movement of the belt causes movement of the first and second sliders in opposite directions.

Preferably, one of the pulleys is a drive pulley operatively connected to a bidirectional drive motor.

Preferably, the capper is detachably mounted on the mounting bracket.

Preferably, the mounting bracket comprises first and second shafts for hinged connection with respective first and second arms.

Preferably, the first and second arms are interengaged via intermeshed first and second gears rotatably mounted about the first and second shafts, the first and second gears being fixedly positioned relative to their respective first and second arms.

Preferably, at least one of the shafts is a drain shaft, the drain shaft having a hollowed core for receiving fluid drained from the capper.

Preferably, the capper comprises a support base having drain port fluidically connected to the drain shaft.

Preferably, a flexible tube is connected to the drain shaft for carrying fluid away from the capper.

In a sixth aspect, there is provided a printhead capping system comprising:

a mounting bracket comprising a fixed shaft;

a cap assembly mounted on the mounting bracket; and an arm hingedly connected to the shaft, the arm moving the cap assembly between a capping position and a printing position, wherein the shaft is a drain shaft for receiving fluid drained from the cap assembly.

Preferred aspects of the sixth aspect are referenced in respect of the fifth aspect.

In a seventh aspect, there is provided a printhead maintenance system comprising:

a maintenance chassis having a maintenance module, the maintenance module comprising a laterally movable capper;

a print bar chassis movably mounted on the maintenance chassis, the print bar chassis comprising a print module having a printhead and a cover for the capper;

a lift mechanism for raising and lowering the print bar chassis relative to the maintenance chassis between a capping position a printing position; and a retraction mechanism for laterally extending and retracting the capper between the capping position and the printing position, wherein:

the printhead is engaged with the capper in the capping position; and the cover is engaged with the capper in the printing position.

Preferably, the maintenance module comprises a fixed plate, the capper being connected to the plate via one or more arms, and wherein the capper is laterally movable relative to the plate via movement of the arms.

Preferably, the cover is positioned relatively higher than the printhead on the print bar chassis.

Preferably, the print bar chassis is raised relative to the maintenance chassis in the maintenance position.

Preferably, the cover is parallel with the printhead.

Preferably, the capper is extended relative to the fixed plate in the capping position and retracted relative to the fixed plate in the printing position.

Preferably, wherein the capper comprises a perimeter seal and the cover has a length sufficient to sealingly engage with the perimeter seal.

Preferably, the cover comprises a sealing plate for sealing engagement with the perimeter seal.

Preferably, the cover is fixedly attached to part of the print bar chassis.

In an eighth aspect, there is provided a pagewide printing unit for mounting over a media feed path and printing onto media, the printing unit comprising:

a print module having a printhead;

a maintenance module having a fixed frame supporting a capper and a wiper, the print module being movable relative to the fixed frame; and a lift mechanism for raising and lowering the print module relative to the fixed frame between a maintenance position a printing position, wherein the fixed frame is in a same fixed position in both the maintenance and printing positions, and wherein the capper and the wiper are each independently movable relative to the fixed frame.

In a ninth aspect, there is provided a modular printer comprising:

a media support defining a media feed path; and a plurality of pagewide printing units spaced apart along a media feed direction of the media feed path, each printing unit comprising:

a maintenance chassis fixedly positioned over the media feed path; and a print bar chassis seated on the maintenance chassis, the print bar chassis supporting one or more print modules extending across a width of the media feed path, each print module having a respective printhead, a lift mechanism for raising and lowering the print bar chassis relative to the maintenance chassis, wherein each print bar chassis is independently liftable from a printing position in which the print bar chassis is seated on the maintenance chassis to a maintenance position in which the print bar chassis is unseated from the maintenance chassis, and wherein a footprint of each printing unit in both the printing and maintenance positions is defined by a perimeter of the maintenance chassis.

As used herein, the term “ink” is taken to mean any printing fluid, which may be printed from an inkjet printhead. The ink may or may not contain a colorant. Accordingly, the term “ink” may include conventional dye-based or pigment based inks, infrared inks, fixatives (e.g. pre-coats and finishers), 3D printing fluids and the like.

As used herein, the term “mounted” includes both direct mounting and indirect mounting via an intervening part.

BRIEF DESCRIPTION OF THE DRAWINGS

Embodiments of the present invention will now be described by way of example only with reference to the accompanying drawings, in which.

DETAILED DESCRIPTION OF THE INVENTION

Modular Printing System

Figure 1:
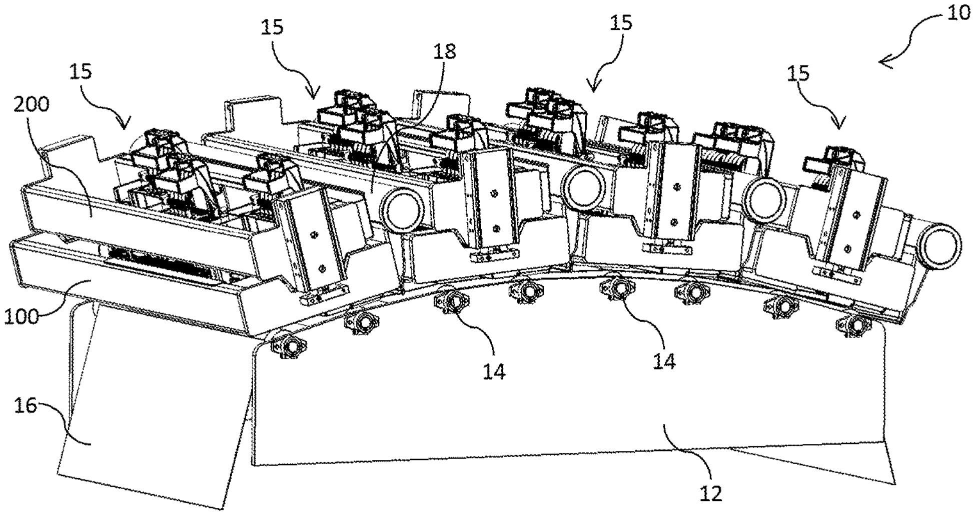
FIG. 1 is perspective of a printer according to the present invention.

Referring to FIG. 1, there is shown a printer 10 according to the present invention. The printer 10 is configured for use as a web-based printing system, such as a digital inkjet press. The printer comprises a media support structure 12 comprising a series of rollers 14 defining an arcuate media feed path for a web 16 of print media. The web 16 may be supplied from an input roller and wound onto an output roller using a web-feed mechanism (not shown) as known in the art.

The printer 10 comprises four pagewide printing units 15 aligned along the media feed path. Each printing unit 15 extends across a full width of the media feed path and is configured for printing onto the web 16 of print media in a single pass. Typically, each printing unit 15 is configured for printing a single color of ink. In the arrangement shown in FIG. 1, each printing unit 15 prints one of cyan, magenta, yellow and black inks for full color printing. However, it will be appreciated that other arrangements of one or more printing units 15 are with the ambit of the present invention. For example, an additional printing unit 15 may be employed for printing a spot color (e.g. orange) or a fixative, or fewer printing units may be employed for monochrome printing.

Each printing unit 15 comprises a maintenance chassis 100 fixedly positioned over the media feed path and a print bar chassis 200 seated on the maintenance chassis. Each printing unit 15 may additionally comprise an aerosol collector 18 positioned downstream of the print bar chassis 200 for collecting ink mist and other particulates generated during high-speed printing. Alternatively, the aerosol collectors 18 may be installed in the printer 10 separately from the printing units 15. Each aerosol collector 18 may be modular to enable aerosol collectors of different lengths to be readily manufactured. For example, the aerosol collector 18 may comprise an elongate vacuum tube 18A and a plurality of modular nozzle units 18B slotted into the vacuum tube (see FIG. 6).

Figure 2:
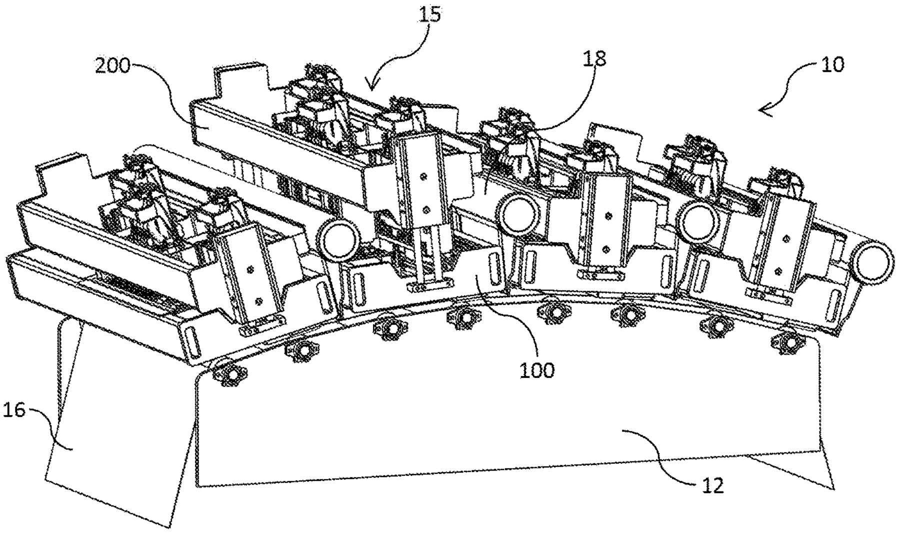
FIG. 2 is a perspective of the printer shown in FIG. 1 with a single printing unit in a maintenance position.

Referring now to FIG. 2, each print bar chassis 200 is independently liftable from its respective maintenance chassis 100. Only one print bar chassis 200 is lifted in FIG. 2, although it will be appreciated that more than one or all print bar chassis 200 may be lifted for the purpose of performing printhead maintenance. With the print bar chassis 200 seated on the maintenance chassis 100, the printing unit 15 is configured in a printing position for printing on the web 16; and with the print bar chassis 200 unseated from the maintenance chassis 100, the printing unit 15 is configured either in a transition position or in a maintenance position for performing printhead maintenance operations (e.g. wiping or capping). Generally, the print bar chassis 200 is raised to its highest transition position when transitioning from the printing position to the maintenance position and vice versa.

Since the media feed path is generally arcuate and each maintenance chassis 100 is fixed relative to the media support 12, each print bar chassis 200 moves radially outwards from the arcuate media feed path when lifted from its respective maintenance chassis.

Figure 3:
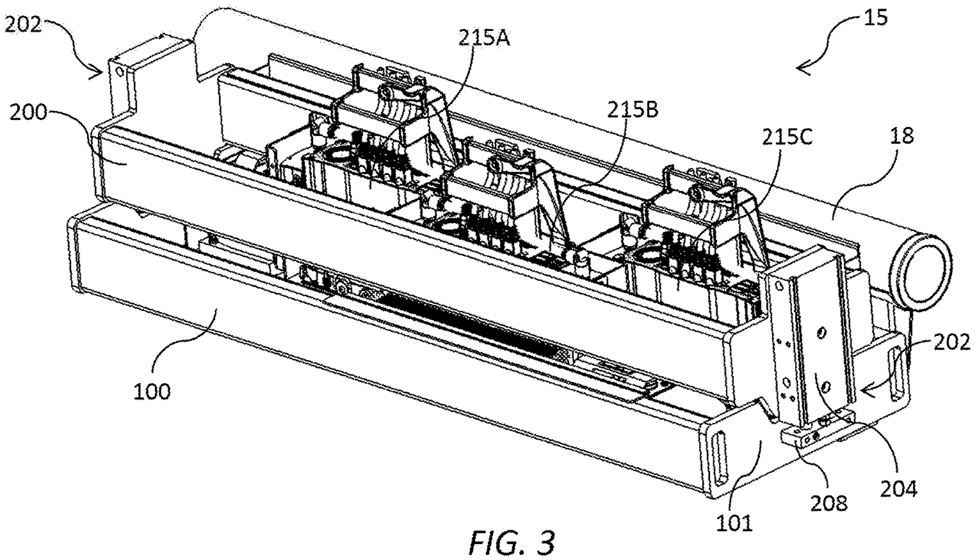
FIG. 3 is a front perspective of an individual printing unit in a printing position.
Figure 4:
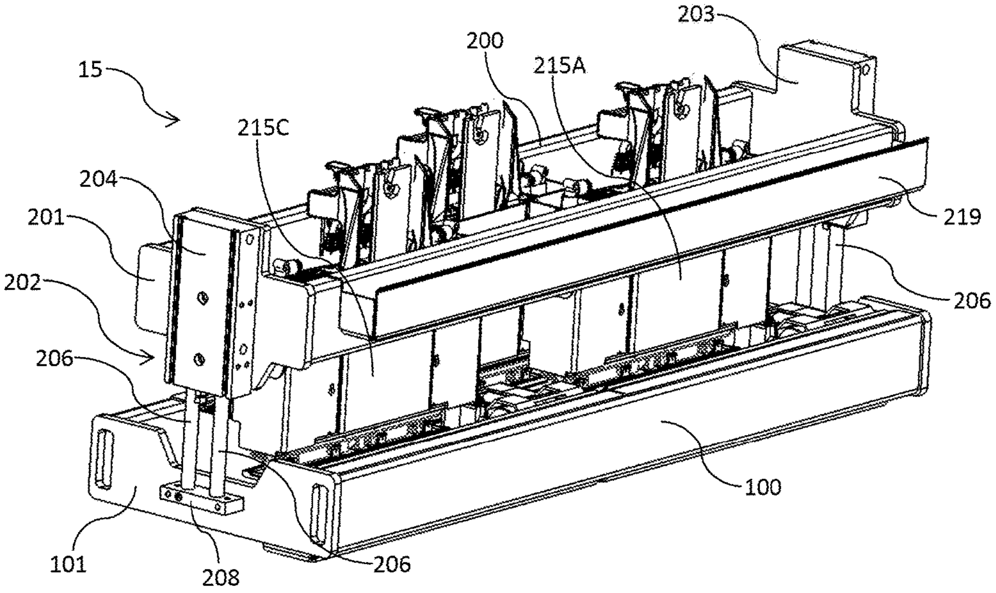
FIG. 4 is a rear perspective of the printing unit in a maintenance position.

FIGS. 3 and 4 show an individual printing unit 15 in the printing and maintenance positions respectively. The aerosol collector 18 has been removed in FIG. 4 for clarity.

The print bar chassis 200 comprises a pair of print bar chassis endwalls 201 connected via a pair of longitudinal print bar chassis sidewalls 203, which together form a rigid chassis for mounting various print bar components. Likewise, the maintenance chassis 100 comprises a pair of maintenance chassis endwalls 101 connected via a pair of longitudinal maintenance chassis sidewalls 103, which together form a rigid chassis for mounting various maintenance components. The maintenance chassis 100 is generally wider than the print bar chassis 200.

As best shown in FIG. 4, a cable tray 219 is attached to one sidewall of the print bar chassis 200 for supporting bundles of electrical cables (not shown) and fluidic tubes (not shown).

The print bar chassis 200 is liftable by virtue of a pair of lift mechanisms 202 positioned one at each end of the printing unit 15. Each lift mechanism 202 comprises a lift housing 204 mounted on a respective endwall 201 of the print bar chassis 200 and a pair of lift rods 206, which are extendable and retractable from the lift housing. The lift rods are 206 are engaged with a fixed reaction plate 208 extending from each endwall 101 of the maintenance chassis 100. From FIGS. 3 and 4, it will be readily appreciated that extension of the lift rods 206 from the lift housing 204 lifts the print bar chassis 200 away from the maintenance chassis 100 into the maintenance position; and retraction of the lift rods 206 into the lift housing 204 lowers the print bar chassis 200 onto the maintenance chassis 100. Any suitable mechanism may be employed for extension and retraction of the lift rods 204 e.g. rack-and-pinion mechanism, pneumatic mechanism etc.

Figure 5:
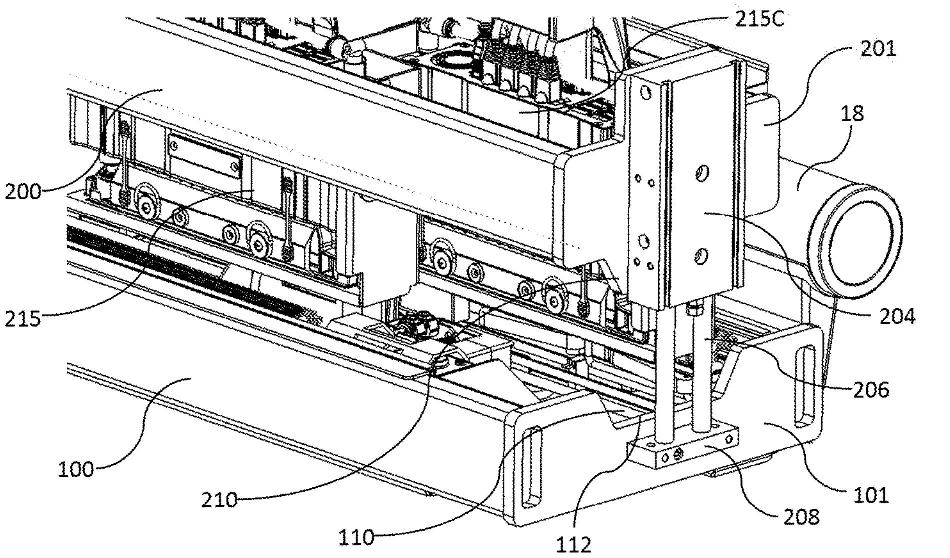
FIG. 5 is magnified front perspective of an end part of the printing unit in a maintenance position.

Referring to FIGS. 4 and 5, the maintenance chassis 100 and print bar chassis 200 have complementary upper and lower surfaces respectively, which enable the print bar chassis to be seated on the maintenance chassis in the printing position shown in FIG. 3. In particular, and referring now to FIG. 5, a tongue 210 protruding downwards from each endwall 201 of the print bar chassis 200 is configured for engagement in a complementary recess 110 defined in end endwall 101 of the maintenance chassis 100 when the print bar chassis is lowered into the printing position. The recess 110 has an abutment surface 112 which defines a datum for the print bar chassis 200 when the tongue 210 engages with the abutment surface. Therefore, the maintenance chassis 100, which is fixed relative to the media support 12, provides a datum for the print bar chassis for controlling the pen-paper-spacing (PPS) in the printing position. It will be appreciated that other datuming arrangements are also within the ambit of the present invention. For example, the print bar chassis 200 may be datumed against a fixed part of the media support 12.

Figure 6:
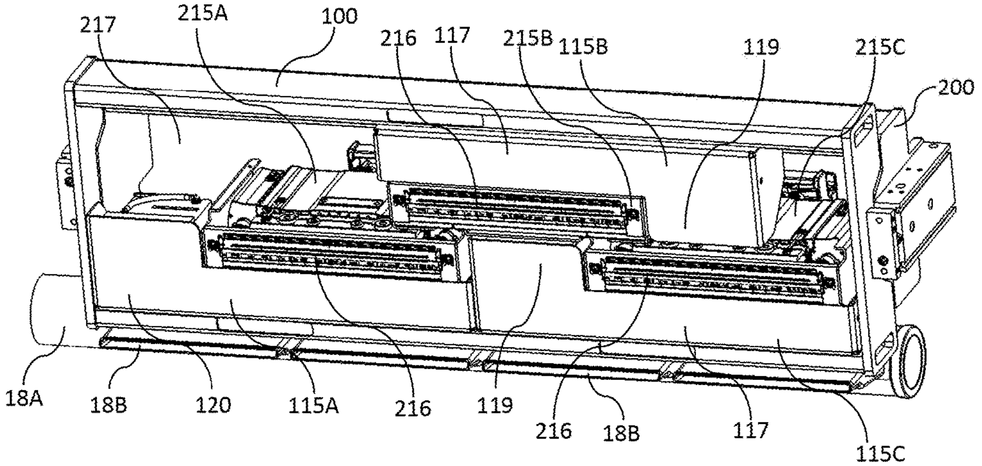
FIG. 6 is a bottom perspective of the printing unit in a printing position.

As best shown in FIGS. 3 and 6, the print bar chassis 200 supports a modular array of print modules 215 which are positioned in a staggered overlapping arrangement so to extend across a full width of the media feed path. In the embodiment shown, the print bar chassis 200 supports three print modules 215A, 215B and 215C, although it will be appreciated that the print bar chassis may have any number of print modules 215 depending on the width of media to be printed. Each print module 215 comprises a respective inkjet printhead 216 for printing onto print media, and each printhead 216 may be comprised of multiple printhead chips as known in the art.

The print modules 215 are mounted in the print bar chassis 200 so as to extend through an internal cavity 217 defined by the maintenance chassis 100 in the printing position. Accordingly, in the printing position, each printhead 216 is positioned at a suitable spacing from the print media and protrudes somewhat below a lower surface of the maintenance chassis 100.

Figure 8:
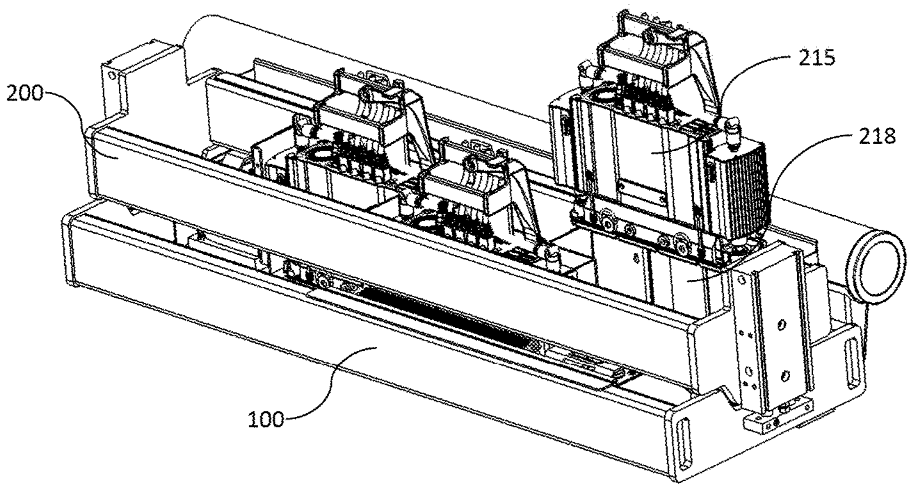
FIG. 8 is a front perspective of the printing unit with one print module removed.

Referring to FIG. 8, each print module 215 is slidably received in a respective sleeve 218 fixedly mounted on the print bar chassis 200. Each sleeve 218 provides a means for releasably and securely mounting each print module 215 to the print bar chassis 200. Accordingly, print modules 215 may be readily removed by the user for replacement of printhead cartridges 252 or replacement of entire print modules. A common datum plate (not shown) extending across the print bar chassis 200 ensures that each print module 215 has a known fixed position relative to the print bar chassis when each print module is locked into its respective sleeve 218. Likewise, each print module 216 is engaged with fixed datums (not shown) of the sleeve 218.

Maintenance Module

Returning to FIGS. 6 and 7, the maintenance chassis 100 supports first, second and third maintenance modules 115A, 115B and 115C (collectively "maintenance modules 115"), one for each of respective first, second and third print modules 215A, 215B and 215C (collectively "print modules 215"). The maintenance modules 115 are fixedly mounted to the maintenance chassis 100, and each defines a space or opening through which a respective print module 215 can extend and retract between the printing and maintenance positions, respectively. In the embodiment shown, each maintenance module 115 has a generally L-shaped frame 120, which is arranged to wrap around two sides of its respective print module 215. The L-shaped frame 120 has a longer leg 117 extending parallel with a length dimension of the print module 215 and a shorter leg 119 extending parallel with a width dimension of the print module.

The L-shaped frame 120 of each maintenance module 115 enables a compact arrangement of the maintenance modules for the staggered overlapping print modules 215, which are positioned in two parallel rows. As shown in FIG. 6, the shorter leg 119 of the third maintenance module 115C is interposed between adjacent first and third print modules 215A and 215C aligned in the same row. It will be appreciated that with a wider print bar having more than two print modules 215 in the same row, every adjacent pair of print modules in one row will have a shorter leg 119 of a maintenance module positioned therebetween.

Still referring to FIG. 6, it can be seen that the second maintenance module 115B is reversed (rotated by 180 degrees) for the offset second print module 215B; that is, the longer leg 119 of the second maintenance module 115B is relatively distal from the longer legs of the first and third maintenance modules 115A and 115C. This allows the second print module 215B to be placed in close proximity to the first and third print modules 215A and 215C with respect to the media feed direction. Hence, the width of the print zone in the media feed direction is minimized, which is optimal for maintaining good print quality. The compact packing arrangement of the maintenance modules 115 and print modules 215 enables a flexible design approach for each printing unit 15, such that a large number of print modules 215 may be staggered across wide media widths whilst still allowing efficient maintenance of each printhead 216 in the printing unit. Thus, each printing unit 15 is truly modular with the design readily expandable to any printing width.

Figure 9:
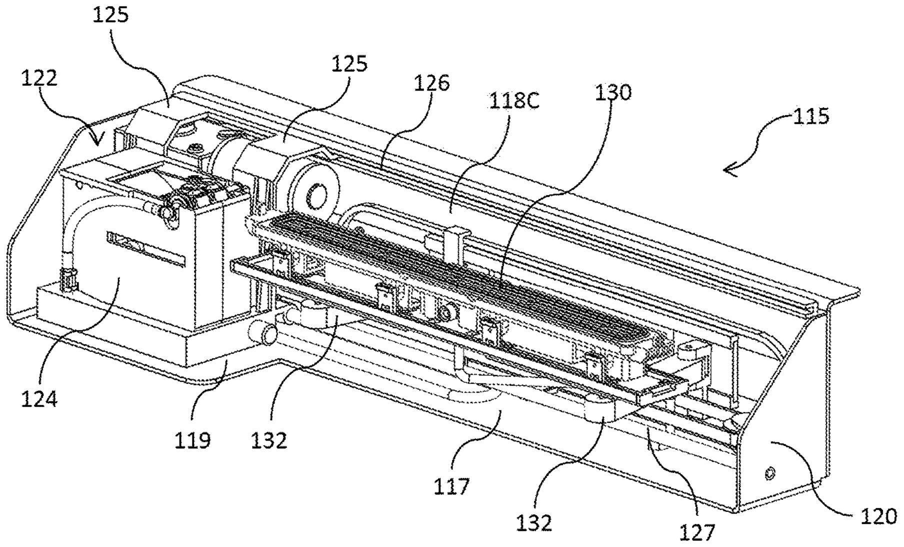
FIG. 9 is a top perspective of a maintenance module during printhead wiping.
Figure 10:
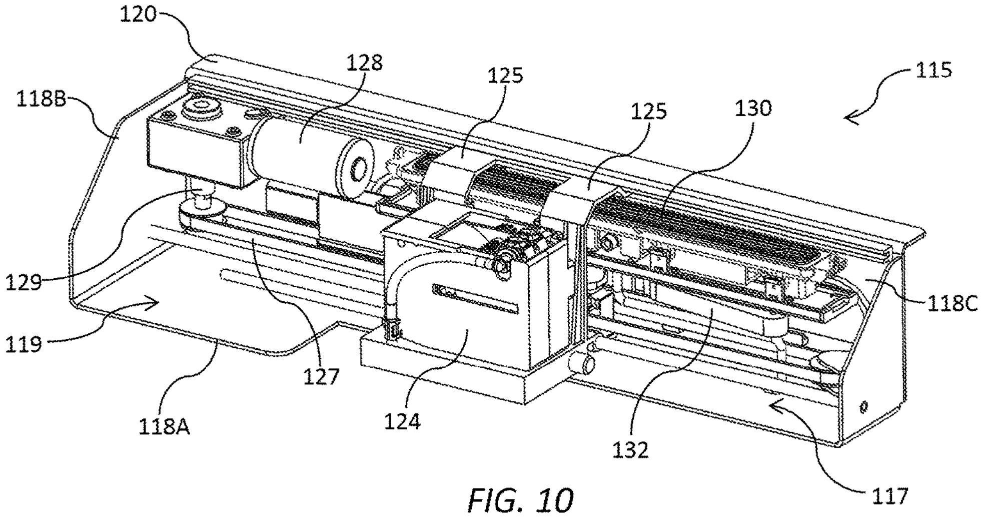
FIG. 10 is a top perspective of a maintenance module during printhead capping.

Referring to FIGS. 9 and 10, an individual maintenance module 115 is shown in perspective. The L-shaped frame 120 of the maintenance module 115 comprises a base plate 118A with a shorter side plate 118B and a longer side plate 118C extending upwards therefrom. The shorter leg 119 comprises the shorter side plate 118B and a corresponding part of the base plate 118A; the longer leg 117 comprises the longer side plate 118C and a corresponding part of the base plate 118A. The L-shaped frame 120 houses a wiper 122 for wiping a respective printhead 216 and a capper 130 for capping the printhead.

As shown in FIG. 9, the wiper 122 is in its home or parked position, whereby the wiper is positioned within the shorter leg 119 of the L-shaped frame 120. As shown in FIG. 10, the capper 130 is in its home or parked position, whereby the capper is positioned within the longer leg 117 of the L-shaped frame 120.

The wiper 122 is of a type having a wiping material 123 (shown in FIG. 11) mounted on a carriage 124, which moves longitudinally along a length of the print module 215 to wipe the printhead 216. The carriage 124 is supported by one or more overhead arms 125, which are slidingly engaged in a guide rail 126 fixed to the longer side plate 118C and extending along the longer arm 119 of the frame 120. In FIG. 10, the carriage 124 has moved from its home position and is partway through a longitudinal wiping operation. It can be seen that the overhead arms 125 bridge over the capper 130 in its parked position during the wiping movement of the carriage 124. The carriage 124 is traversed by means of a first endless belt 127 driven by a bidirectional carriage motor 128 and belt drive mechanism 129. Printhead wipers of the type having a carriage carrying a web of wiping material are described in, for example, U.S. Pat. No. 4,928,120.

The capper 130 comprises a conventional perimeter capper, which is mounted to the longer side plate 118C of the L-shaped frame 120 via a pair of hinged arms 132, which laterally extend and retract the capper into and away from a space occupied by the printhead 216 by means of a suitable retraction mechanism. The capper 130 is shown in its capping position in FIG. 9 with both arms 132 extended.

For capping operations, the print bar chassis 200 is unseated from the maintenance chassis 100 and raised from a printing position to the transition position, each capper 130 is extended, and the print bar chassis 200 then gently lowered such that the each printhead 216 is capped by a perimeter seal cap 176 of its respective capper. The reverse process configures the printing unit 15 back into the printing position.

Figure 7:
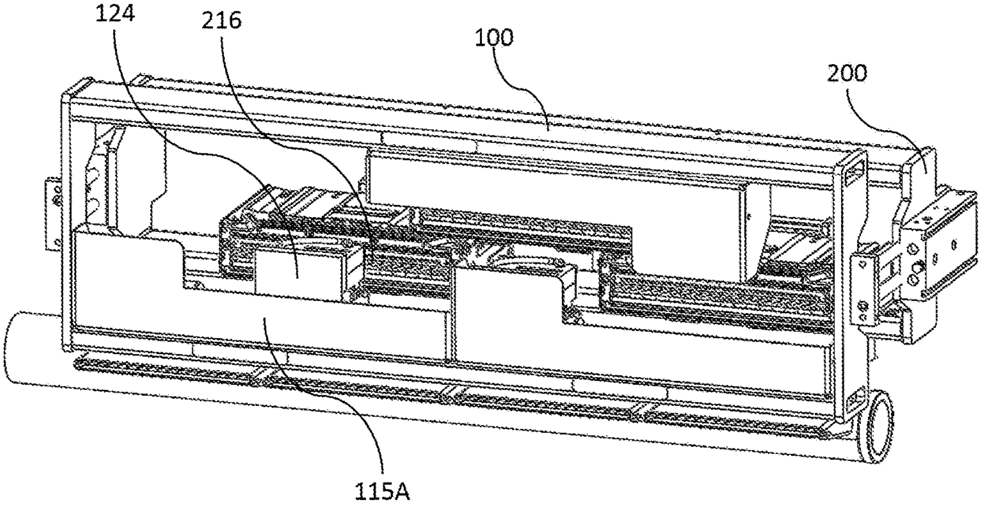
FIG. 7 is a bottom perspective of the printing in a maintenance position with one printhead being wiped.

Similarly, for wiping operations, the print bar chassis 200 is unseated from the maintenance chassis 100 and raised from a printing position to a transition position, and then gently lowered such that each printhead 216 is engaged with its respective wiper 122. Typically, the wiping material 123 is resiliently mounted to allow a generous tolerance when the print bar chassis 200 is lowered. With the wiper 122 engaged with the printhead 216, the carriage 124 is traversed lengthwise along the printhead to wipe ink and/or debris from the nozzle surface of the printhead. FIG. 7 shows one printhead 216 being wiped by its respective wiper in the maintenance position.

It will be appreciated that, with the arrangement of maintenance modules 115 shown in FIGS. 6 and 7, the carriage 124 of the reversed second maintenance module 115B moves in an opposite longitudinal wiping direction to carriages of the first and second maintenance modules 115A and 115C. Since it is convenient from a manufacturing standpoint for all maintenance modules 115 to be identical, and since printheads 216 are typically asymmetrically positioned with respect to their print module 215, then different regions (or strips) of the wiping material 123 may be used in different maintenance modules depending on the wiping direction. In practice, the wiping material 123 is sufficiently wide to enable wiping of printheads 216 in either direction.

Figure 11:
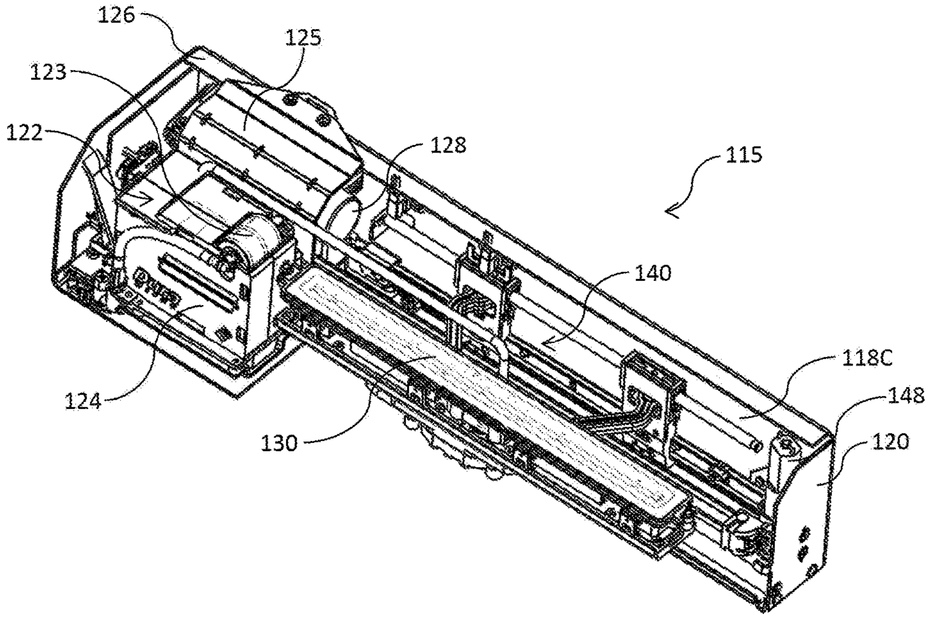
FIG. 11 is a top perspective of an alternative maintenance module during printhead capping.
Figure 12:
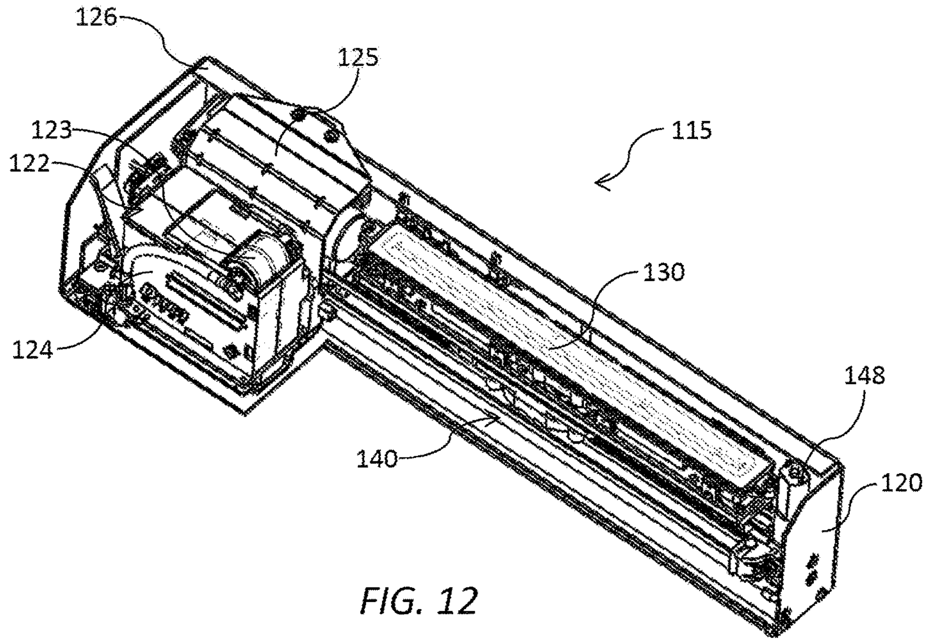
FIG. 12 is a top perspective of the alternative maintenance module during printing.

FIGS. 11 and 12 show an alternative embodiment of the maintenance module 115 in which the retraction mechanism takes the form of a scissor mechanism 140 for extending and retracting the capper 130. Where relevant, like reference numerals have been used to depict like features in each embodiment of the maintenance module 115.

The scissor mechanism 140 achieves stable lateral movement of the capper 130 away from and towards the longer side plate 118C of the L-shaped frame 120, whilst maintaining a parallel orientation of the capper with respect to the printhead 216. In FIG. 11, the capper 130 is in its extended (capping) position, and in FIG. 12 the capper is in its retracted (parked) position.

Figure 13:
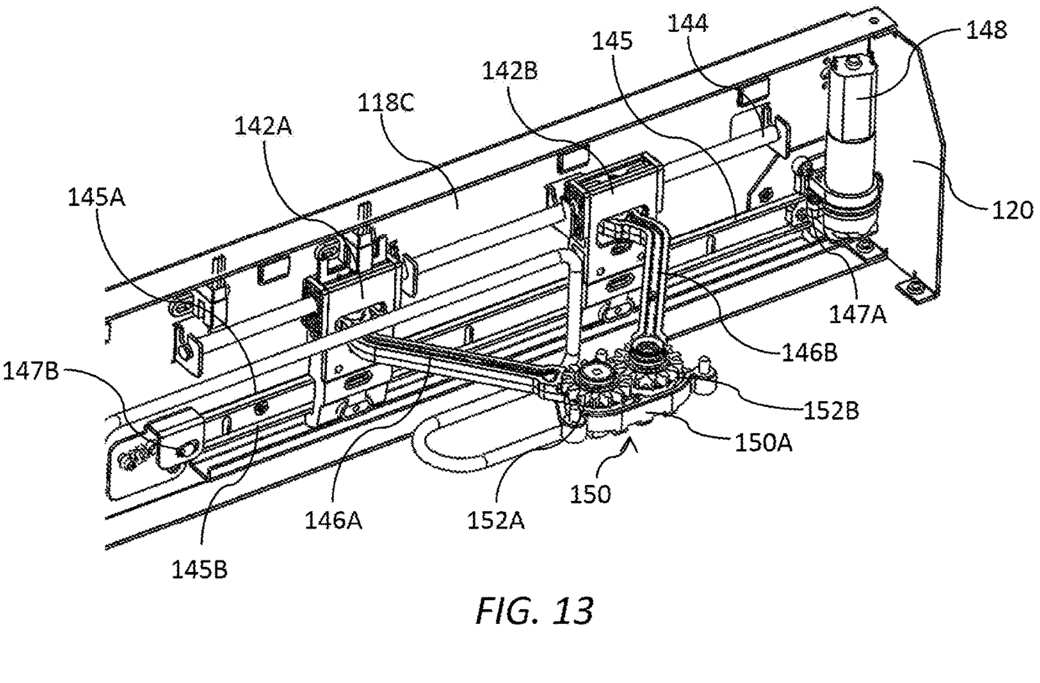
FIG. 13 is a top perspective of a scissor mechanism for controlling lateral movement of a capper.
Figure 14:
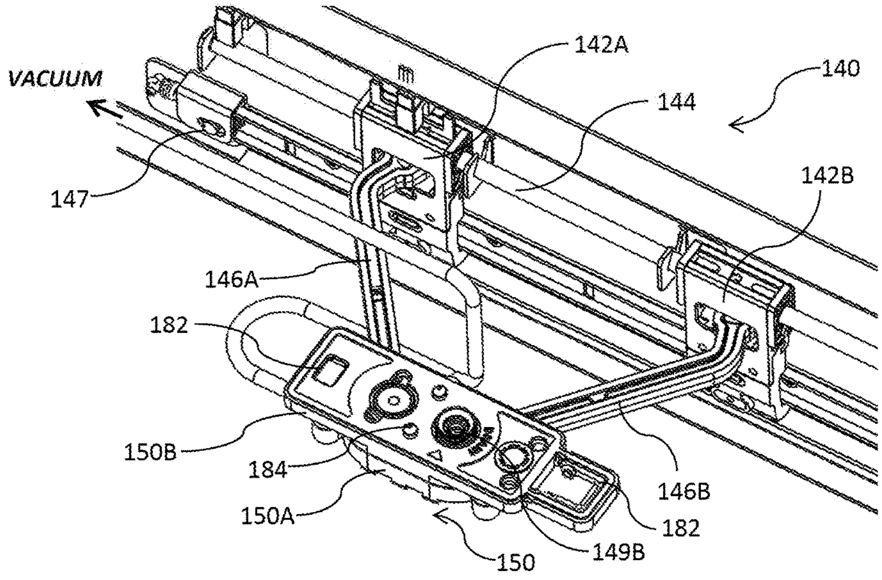
FIG. 14 is a top perspective of the scissor mechanism with mounting bracket.

Referring now to FIGS. 13 and 14, the scissor mechanism 140 comprises first and second sliders 142A and 142B slidably mounted on a guide rod 144, which is fixedly mounted on the longer side plate 118C of the L-shaped frame 120. The first and second sliders 142A and 142B are slidably movable along a longitudinal axis of the guide rod 144 in opposite directions. Hence, the sliders 142A and 142B move either towards each other or away from each other.

Movement of the sliders 142A and 142B is controlled by a second endless belt 145 extending in a loop along the longer side plate 118C. The second endless belt 145 is tensioned between a pair of pulleys 147 (drive pulley 147A and idler pulley 147B) rotatably mounted to the longer side plate 118C and having axes of rotation perpendicular to a longitudinal axis of the longer side plate. The first slider 142A is engaged with an upper belt portion 145A, while the second slider 142B is engaged with a lower belt portion 145B of the second endless belt 145. The second endless belt 145 is driven by a bidirectional capper drive motor 148 operatively connected to the drive pulley 147A, which rotates the second endless belt 145 either clockwise or anticlockwise.

The first slider 142A is hingedly connected to a proximal end of a first arm 146A, with an opposite distal end of the first arm hingedly connected to a mounting bracket 150. Likewise, the second slider 142B is hingedly connected to a proximal end of a second arm 146B, with an opposite distal end of the second arm hingedly connected to the mounting bracket 150. Each arm 146 is bent having an elbow portion proximal its respective slider 142. In the embodiment shown in FIGS. 13 and 14, the mounting bracket 150 is a two part bracket having a lower bracket part 150A fixed to an upper mounting part 150B.

The mounting bracket 148, first and second arms 146A and 146B, and first and second sliders 142A and 142B together form the scissor mechanism 140 for moving the capper 130 laterally towards and away from the longer side plate 118C. In this embodiment, clockwise rotation of the endless belt 145 moves the sliders 142 towards each other and, hence, extends the capper 130 laterally away from the longer side plate 118C into a capping position. Anticlockwise rotation of the endless belt 145 moves the sliders 142 away from each other and, hence, retracts the capper 130 laterally towards the longer side plate 118C into a parked position for printing.

Figure 15:
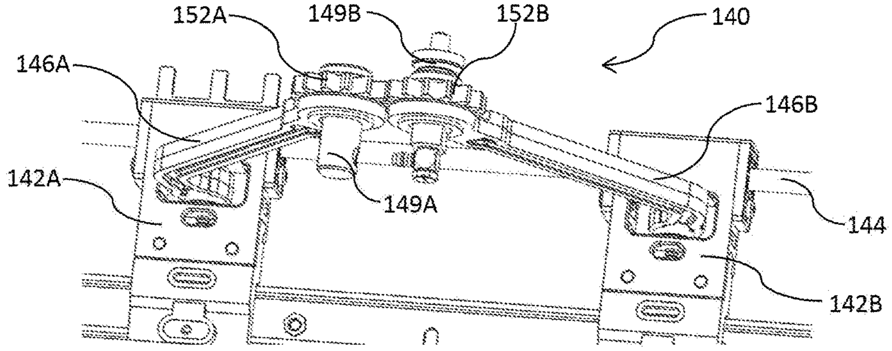
FIG. 15 is a bottom perspective of the scissor mechanism.
Figure 16:
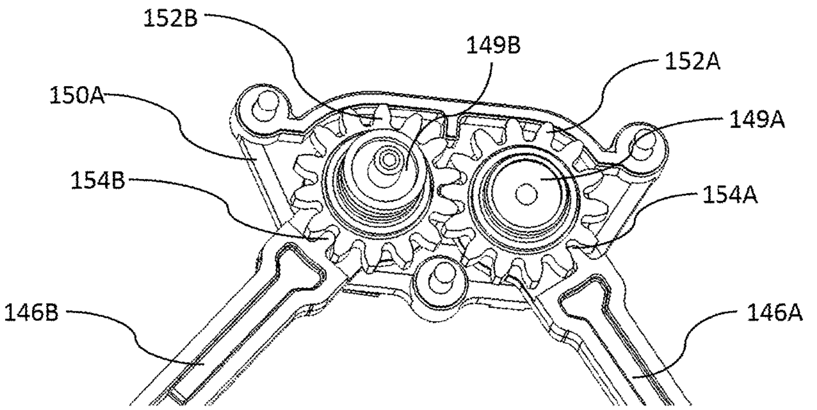
FIG. 16 is a magnified view of intermeshed gear wheels of the scissor mechanism.

Symmetric movement of the arms 146 and, consequently, parallel movement of the capper 130 with respect to the longer side plate 118C is assured by means of a gear arrangement interengaging the distal ends of the first and second arms 146A and 146B. Referring now to FIGS. 15 and 16, the distal ends of the first and second arms 146A and 146B are each journaled for receiving respective first and second shafts 149A and 149B fixed to the mounting bracket 150. Hence, the distal ends of the arms 146A and 146B are hingedly connected to the mounting bracket 150 via the first and second shafts 149A and 149B. A first gear wheel 152A is rotatably mounted about the first shaft 149A in a locked orientation with respect to the first arm 146A by virtue of a first dog projection 154A of the first arm engaged with the first gear wheel. Similarly a second gear wheel 152B is mounted about the first shaft 149B and in a locked orientation with respect to the second arm 146B by virtue of a second dog projection 154B of the second arm engaged with the second gear wheel. The first and second gears wheels 152A and 152B are intermeshed so as to constrain movement of the first and second arms 146A and 146B only to mirror-symmetric movement. Therefore, the scissor mechanism 140 provides highly controlled extension and retraction of the capper 130 for alignment with the printhead 216 without requiring a bulky sled arrangement or the like, such as the sled arrangement described in WO2011/143699.

Figure 17:
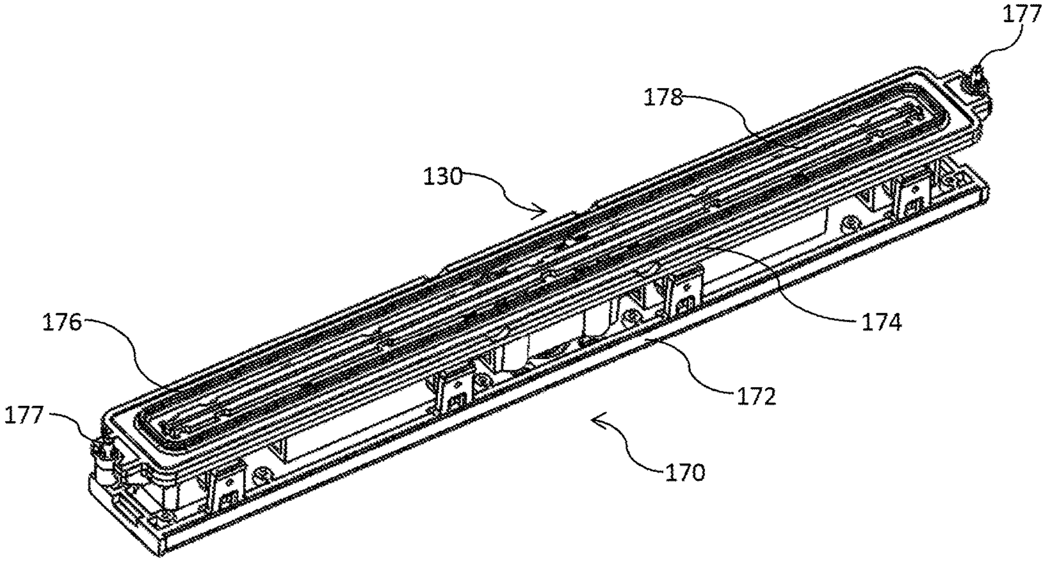
FIG. 17 is a top perspective of a cap assembly.
Figure 18:
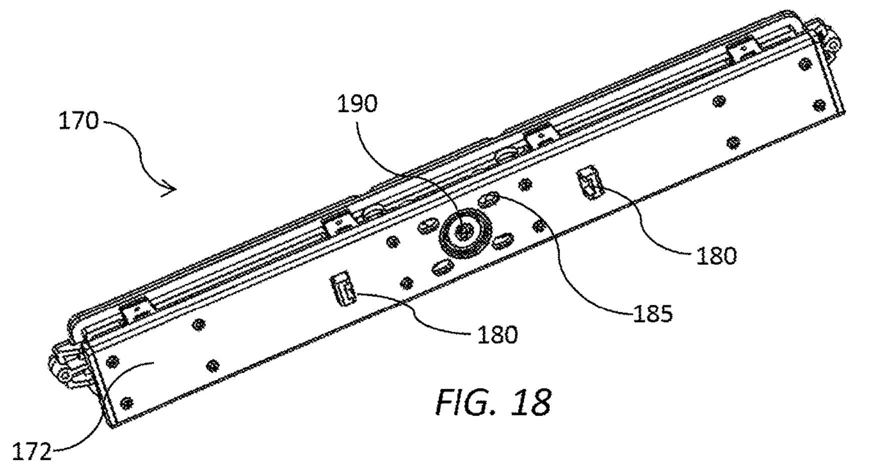
FIG. 18 is a bottom perspective of the cap assembly.
Figure 19:
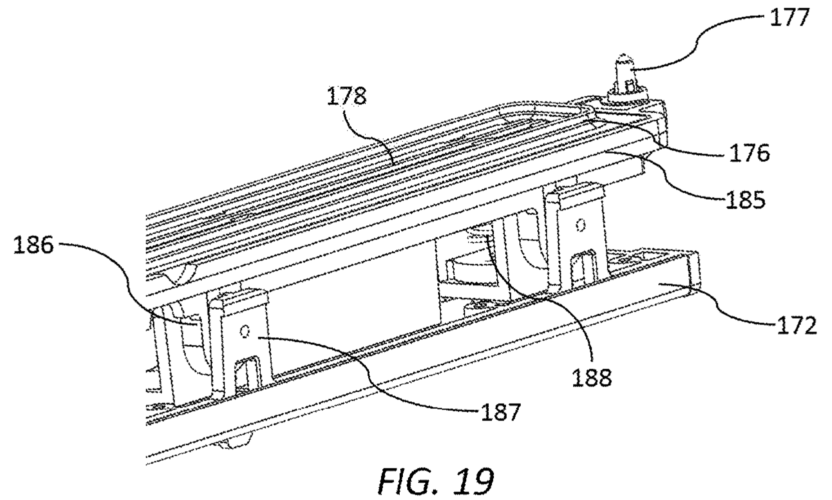
FIG. 19 is a magnified view of one end of the cap assembly.

Referring to FIGS. 17 to 19, a cap assembly 170 comprises a cap support 174 resiliently mounted to a rigid base 172. The capper 130 comprises the cap support 174 and a perimeter seal cap 176, which is comprised of a compliant material (e.g. rubber) for sealing engagement with the printhead 216. Alignment/datum features 177 extend upwardly from each end of the cap support 174 for engagement with complementary datum features (not shown) on a lower surface of a sleeve 218 in which a respective print module 215 is nested.

The capper 130 maintains a humid environment for the printhead 216 when the printhead is capped. A length of absorbent material 178 is positioned longitudinally within the bounds of the perimeter seal cap 176. The absorbent material 178 may receive flooded ink from the printhead 216 and/or act as a spittoon for receiving ink spitted from printhead nozzles during capping.

The cap assembly 170 is designed as a user-replaceable component of the maintenance module 115 and the rigid base 172 is configured for releasable attachment to the mounting bracket 150. Referring to FIGS. 14 and 18, the base 172 and the upper mounting part 150B comprise features for alignment and snap-locking engagement of the cap assembly 170 with the mounting bracket 150. In particular, a pair of snap-lock lugs 180 project downwardly from the base 172 for engagement with complementary snap-lock fasteners 182 of the upper mounting part 150B. Further, alignment pins 184 of the upper mounting part 150B are configured for engagement with complementary alignment openings 185 of the base 172. The alignment pins 184 and/or complementary alignment openings 185 may be keyed to ensure the cap assembly 170 is fitted in the correct orientation for each maintenance module 115.

The cap support 174 is movable towards and away from the base 172 by means of a plurality of complementary slidably engaged legs projecting upwardly and downwardly from the base and cap support, respectively. In the embodiment of FIG. 19, each downwardly projecting leg 186 of the cap support 174 has a groove (not shown) for sliding engagement with a pin (not shown) of each upwardly projecting leg 187 of the base 172. However, it will be appreciated that any suitable mechanical engagement of the base 172 and cap support 174 may be used to provide the requisite relative movement. The cap support 174 is resiliently biased away from the base 172 by means of a plurality of compressions springs 188 engaged between the cap support and the base. Accordingly, the cap support 174 is able to gently resist the downward force of the printhead module 215 when it moves into engagement with the perimeter seal cap 176 during capping. In this way, mechanical strain on the scissor mechanism 140, and particularly the arms 146, is minimized during capping.

Briefly referring back to FIG. 18, the underside of the base 172 comprises a drain port 190 in fluid communication with the absorbent material 178. Any fluid received by the absorbent material 178 is able to drain under gravity and/or capillary action and channeled through the cap assembly 170 towards the drain port 190. When the cap assembly 170 is fitted onto the mounting bracket 150, the drain port 190 is configured to align and fluidically connect to the hollowed second shaft 149B, which functions as a drain shaft. The drain port 190 may comprise a non-drip valve connector, which allows fluid flow only when the drain port 190 is connected to the drain shaft. Hence, any ink spillages during replacement of the cap assembly 170 can be minimized.

Figure 20:
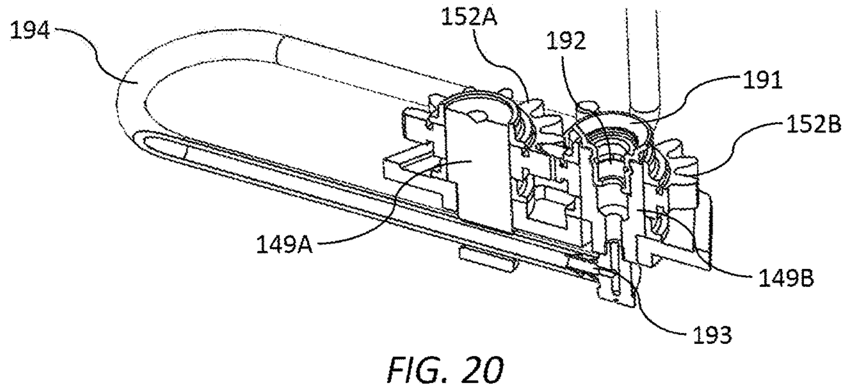
FIG. 20 is a cutaway perspective of a fluid drain shaft.

FIG. 20 shows in detail a fluid flow path through the drain shaft 149B. Fluid is received from the drain port 190 via a flared compliant connector 191 seated at an inlet end 192 of the drain shaft. Fluid flows downwards through the drain shaft 149B and into a drain outlet 193, which is connected to a flexible drain tube 194 via a push-fit connection. The drain tube 194 is connected to a vacuum source, which can periodically remove fluid from the cap assembly 170 under suction, as required.

In order for the absorbent material 178 to maintain its capillarity and to maintain a reliable fluid flow path to the drain port 190, the absorbent material should remain wet at all times. This is especially important with pigment-based inks, whereby precipitated dry pigment particles can clog the absorbent material 178. Whilst printing uninterrupted (i.e. without maintenance interventions) for long periods, the capper 130 may be exposed to atmosphere for long periods and the absorbent material 178 will become dried out.

Figure 21:
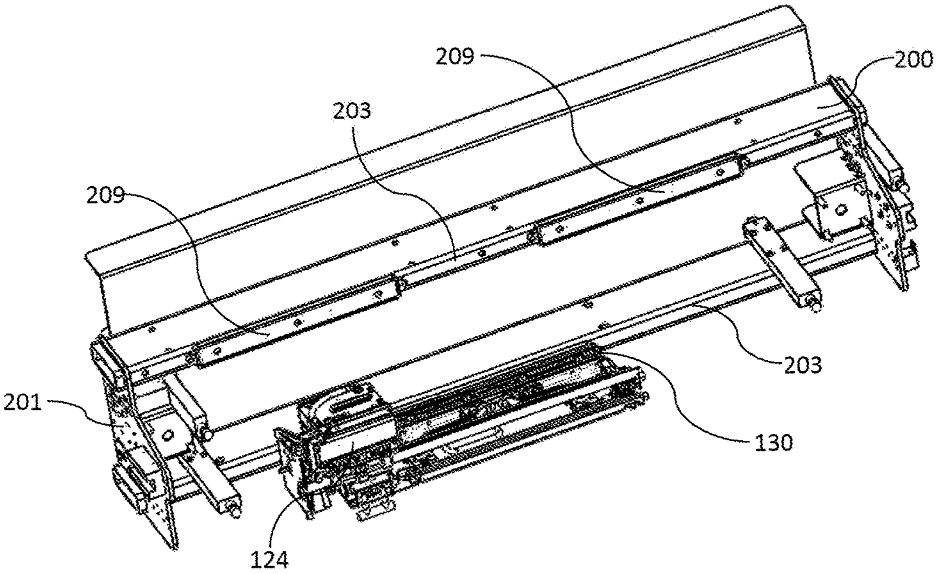
FIG. 21 is a bottom perspective a print bar chassis and a capper.
Figure 22:
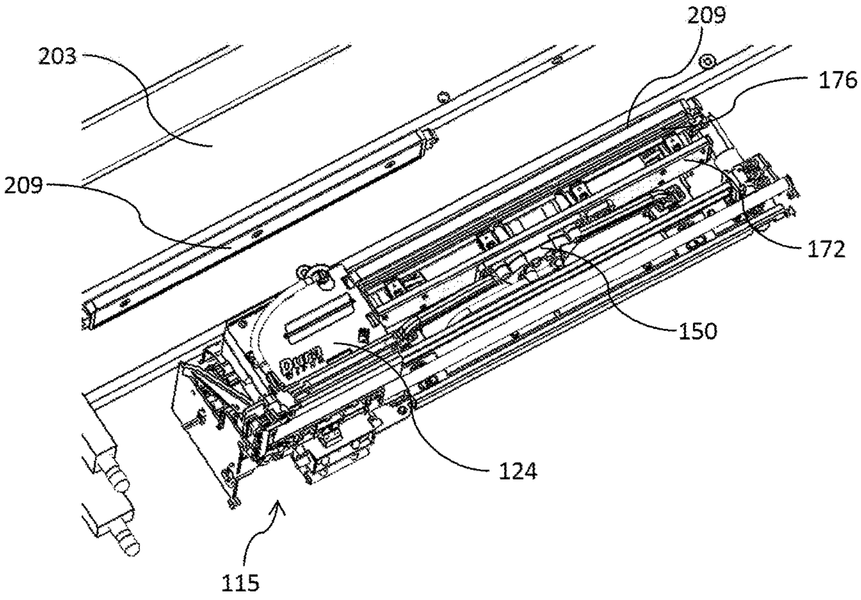
FIG. 22 is a magnified view of the capper aligned and engaged with a cap cover.
Figure 23:
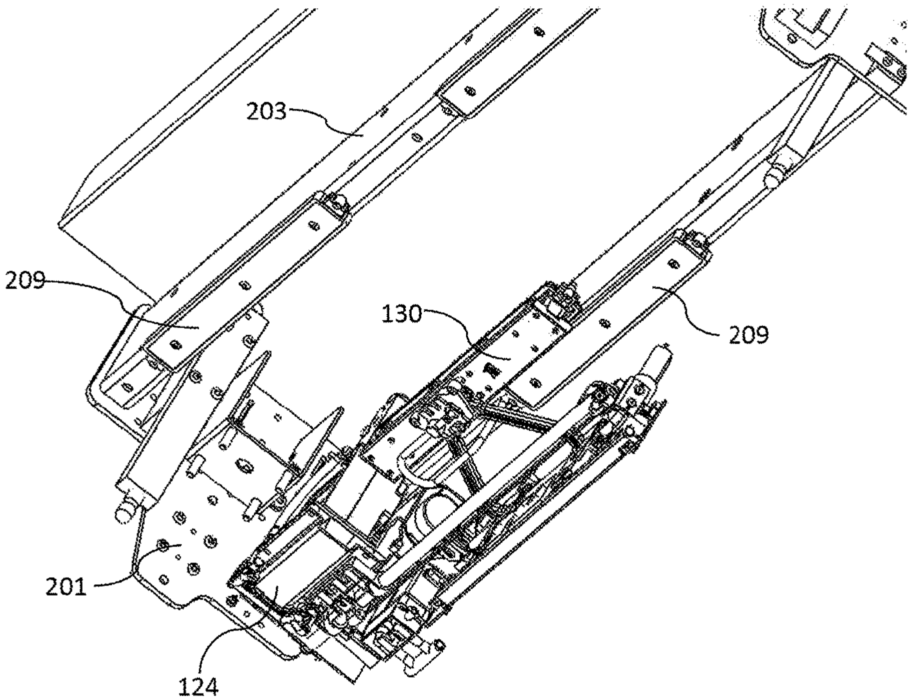
FIG. 23 is bottom perspective of the capper offset from the cap cover.

Referring now to FIGS. 21 to 23, a plurality of cap covers 209 are fixed to a lower surface of the sidewalls 203 of the print bar chassis 200. Each cap cover 209 corresponds to a respective capper 130 and is positioned and configured for sealing engagement with the perimeter seal cap 176 during printing operations. Accordingly, with the capper 130 covered, a humid environment is maintained inside the capper even when it is not being used for printhead capping. Therefore, the absorbent material 178 remains wet at all times enabling efficient drainage of fluid from the capper when required.

The cap cover 209 may be comprised of any suitable rigid material (e.g. plastics, metal etc) and simply presents a uniform surface for sealing engagement with the perimeter seal cap 176.

Although not visible in FIG. 3, with the printing unit 15 in a printing configuration, each capper 130 is retracted and engaged with a respective cap cover 209 of the print bar chassis 200. FIG. 22 shows an individual capper 130 engaged with its respective cap cover 209 with the maintenance chassis 100 and print modules removed for clarity. The sidewalls 203 of the print bar chassis 200 are suitably positioned for alignment of the cap covers 209 with the cappers 130 when the cappers are in their parked (retracted) positions. Further, the cap covers 209 are in a fixed positioned above a height of the printheads 216, as will be readily appreciated from, for example, FIGS. 4 and 5. Accordingly, when the print bar chassis 200 is lowered into its printing position, each printhead 216 protrudes below a lower surface of a respective maintenance module 115 for printing, and the cap covers 209 simultaneously seal against their respective cappers 130. As shown in FIG. 23, with the printing unit 15 in its maintenance position (FIG. 4) and each capper 130 laterally extended into its capping position, the cappers are no longer aligned with the cap covers 209; rather, each laterally extended capper 130 is aligned with a respective print module 215 for capping its printhead 216.

Print Module

Figure 24:
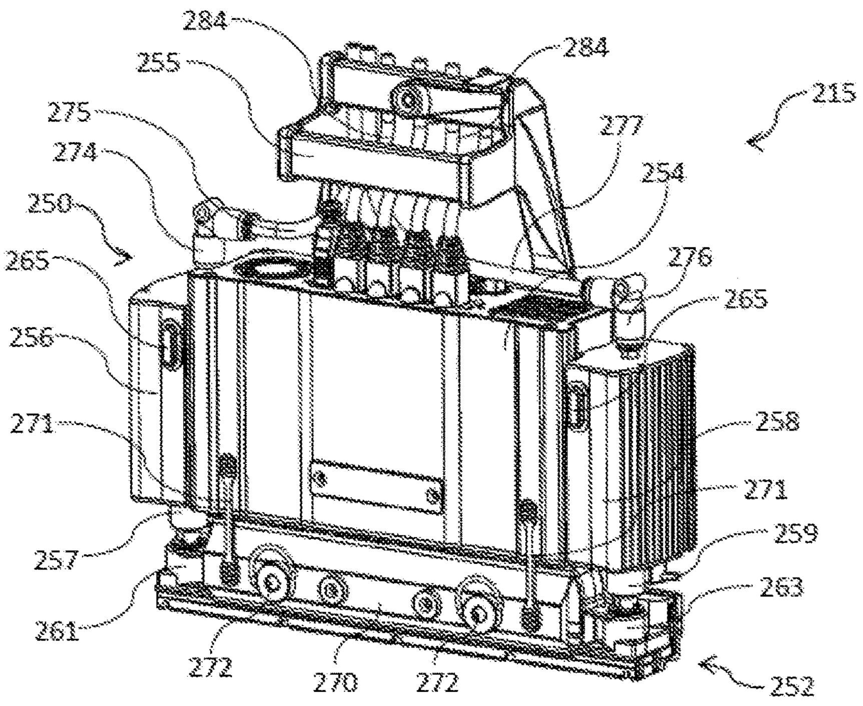
FIG. 24 is a front perspective a print module.
Figure 25:
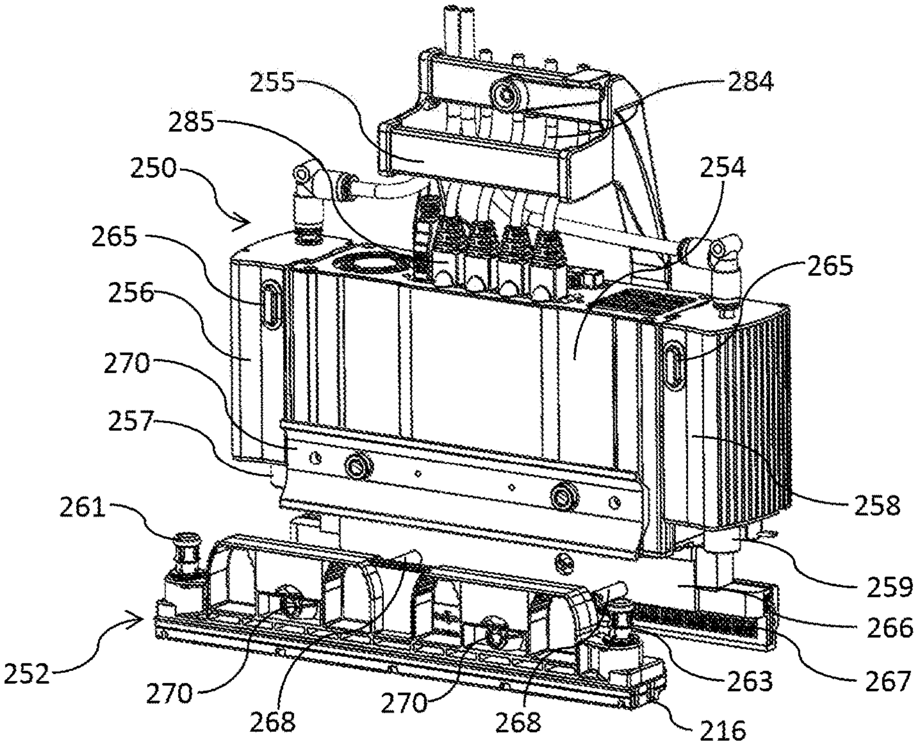
FIG. 25 is a front perspective of the print module shown in FIG. 23 with a print cartridge uncoupled from a supply module.

The print module 215 will now be described in further detail with reference to FIGS. 24 to 31. Turning initially to FIGS. 24 and 25, the print module 215 comprises a supply module 250 engaged with a replaceable printhead cartridge 252, which includes the printhead 216. The printhead cartridge 252 may be of a type described in, for example, the Assignee's co-filed U.S. Provisional Application Nos. 62/377,467 filed 19 Aug. 2016 and 62/330,776 filed 2 May 2016, the contents of which are incorporated herein by reference.

The supply module 250 comprises a body 254 housing electronic circuitry for supplying power and data to the printhead 216. A handle 255 extends from an upper part of the body 254 to facilitate user removal and insertion into one of the sleeves 218 of the print bar chassis 200.

The body 254 is flanked by an ink inlet module 256 and an ink outlet module 258 positioned on opposite sidewalls of the body. Each of the ink inlet and ink outlet modules has a respective ink coupling 257 and 259 engaged with complementary inlet and outlet couplings 261 and 263 of the printhead cartridge 252. The printhead cartridge 252 is supplied with ink from an ink delivery system (not shown) via the ink inlet module 256 and circulates the ink back to the ink delivery system via the ink outlet module 258.

The ink inlet module 256 and ink outlet module 258 are each independently slidably movable relative to the body 254 towards and away from the printhead cartridge 252. Sliding movement of the ink inlet and outlet modules 256 and 258 enables fluidic coupling and decoupling of the printhead cartridge 252 from the supply module 250. As shown in FIG. 14, the ink inlet module 256 and ink outlet module 258 are both lowered and the printhead cartridge 252 is fluidically coupled to the supply module 250. Each of the ink inlet and outlet modules 256 and 258 has a respective manually depressible button 265, which unlocks the modules for sliding movement. As shown in FIG. 25, the ink inlet and outlet modules 256 and 258 are both raised and the printhead cartridge 252 is fluidically decoupled from the supply module 250.

Still referring to FIG. 25, the supply module 250 has a clamp plate 266 extending from a lower part of the body 254. The lower part of the body 254 additionally has a row of electrical contacts 267 for supplying power and data to the printhead 216 via a complementary row of contacts (not shown) on the printhead cartridge 252 when the printhead cartridge is coupled to the supply module 250.

A pair of locating pins 268 extend from the clamp plate 266 perpendicularly with respect to a sliding movement direction of the ink inlet and outlet modules 256 and 258. In order to install the printhead cartridge 252, each locating pin 268 is aligned with and received in a complementary opening 270 defined in the printhead cartridge 252. The printhead cartridge 252 is manually slid in the direction of the locating pins 268 towards the clamp plate 266. Once the printhead cartridge 252 is engaged with the clamp plate 266, a hinged clamp 270, connected to the body 254 via hinges 271, is swung downwards to clamp the printhead cartridge 252 against the clamp plate. The printhead cartridge 252 is locked in place by fasteners 272 on the hinged clamp 270, which mate with the locating pins 268 (FIG. 24). Finally, the ink inlet and outlet modules 256 and 258 are slid downwards to fluidically couple the printhead cartridge 252 to the supply module 250. The reverse process is used to remove the printhead cartridge 252 from the supply module 252. The manual removal and insertion process, as described, can be readily and cleanly performed by users within a matter of minutes and with minimal loss of downtime in a digital press.

The ink supply module 256 is configured for receiving ink at a regulated pressure from an inlet line of an ink delivery system (not shown). A suitable ink delivery system for use in connection with the print modules 215 employed in the present invention is described in the Assignee's U.S. Provisional Application No. 62/330,785 filed 2 May 2016 entitled "Ink Delivery System for Supplying Ink to Multiple Printheads at Constant Pressure", the contents of which are incorporated herein by reference. The ink inlet module 256 has an inlet port 274 for receiving ink from an ink reservoir (not shown) via an inlet line 275, while the ink outlet module 258 has an outlet port 276 for returning ink to the ink reservoir via an outlet line 277.

Figure 26:
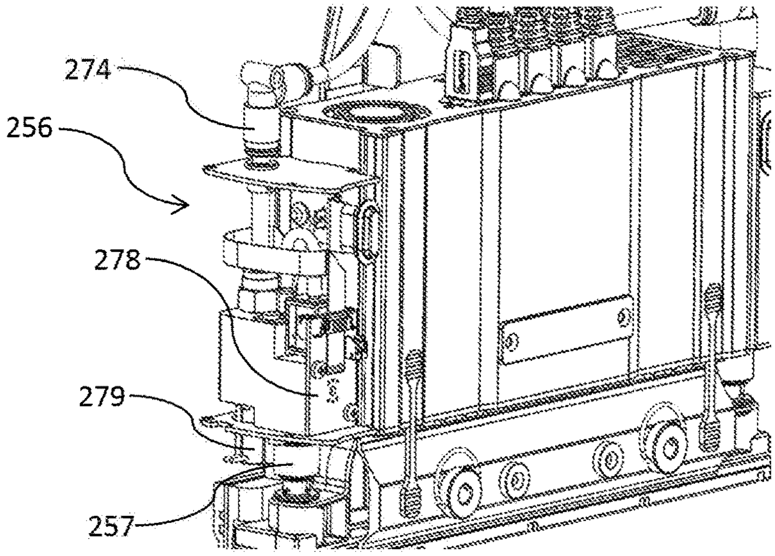
FIG. 26 shows an ink inlet module with a cover removed.

The ink inlet and outlet modules 256 and 258 independently house various components for providing local pressure regulation at the printhead 216, dampening ink pressure fluctuations, enabling printhead priming and de-priming operations, isolating the printhead for transport etc. In FIG. 26, the ink inlet module 256 is shown with a cover removed to reveal certain components of the ink inlet module. For example, there is shown a control PCB 278 having an ink pressure sensor and a microprocessor, which provides feedback to a control valve 279 for controlling a local pressure at the printhead 216. From the Assignee's U.S. Provisional Application No. 62/330,785 filed 2 May 2016, the contents of which are incorporated herein by reference, it will be appreciated that these and other components may be housed in the ink inlet and outlet modules 256 and 258.

Figure 27:
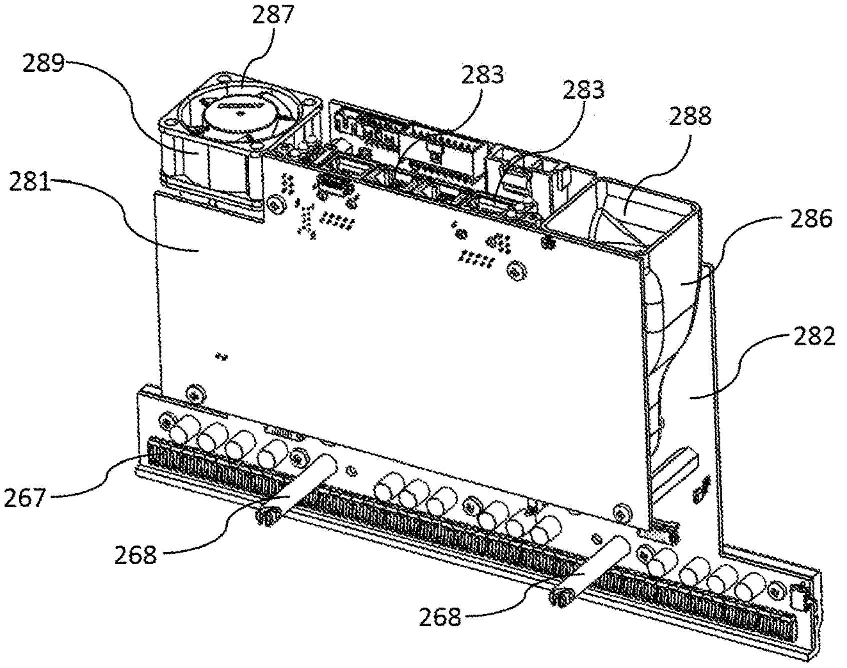
FIG. 27 is a perspective of a PCB arrangement.

Turning now to FIG. 27, there is shown a PCB arrangement, which is housed within the body 254 of the supply module 250. The PCB arrangement comprises a first PCB 281 and a second PCB 282 opposing the first PCB such their respective electronic components face each other. In the embodiment shown, the first PCB 281 is a logic PCB comprising controller chips for image processing and generating print data, and the second PCB 282 is a power PCB comprising drive FETs supplying power to the printhead 216. The first and second PCBs 281 and 282 are electrically coupled together via electrical connectors 299. Data and power is received via a series of electrical input ports 283 positioned at an upper portion of the first PCB. Referring briefly back to FIGS. 24 and 25, input leads 284 are connected to the input ports 283 via suitable connectors 285. At least some of the input leads 284 of each print module 215 are connected to a supervisor processor (not shown), which coordinates each print module of the printer 10 to generate respective monochrome portions of a printed image.

Returning to FIG. 27, a lower part of the second PCB 282 has the row of electrical contacts 267, which supply data and power to the printhead 216, and the pair of locating pins 268, which guide the printhead cartridge 252 onto the clamp plate 266 (not shown in FIG. 27) during installation of the printhead cartridge.

The opposed arrangement of first and second PCBs 281 and 282 advantageously enables a compact design of the print module 215 whilst positioning drive electronics in close proximity to the printhead 216, which is advantageous for power transfer. Additionally, the opposed first and second PCBs 281 and 282 enable efficient cooling of heat-generating electronic components on each PCB, as will now be explained with reference to FIGS. 28 to 31.

An air duct 286 is sandwiched between the first and second PCBs 281 and 282, and defines at least one airflow pathway between an air inlet 287 and an air outlet 288, which are positioned at an upper surface of the print module 215. A fan 289 is positioned at the air inlet 287 to draw in air and generate airflow through the air duct 286 and out of the air outlet 288. Positioning of the air inlet 288 at the upper end of the print module 215 whilst positioning the printhead 216 at an opposite lower end of the print module advantageously separates any ink mist generated by the printhead from the air inlet. Therefore, the air inlet 287 only draws relatively clean, cool air into the air duct 286. Additionally, the air duct 286 isolates the airflow pathway from the first and second PCBs 281 and 282 so that any ink aerosol drawn into the inlet 288 does not have a seriously deleterious effect on sensitive electronic components.

Each of the first and second PCBs 281 and 282 contains heat-generating components, which require cooling by airflow through the air duct 286. Heatsinks, which are thermally coupled to respective heat-generating components of the first and second PCBs 281 and 282, each have a plurality of cooling fins which extend into the air pathway of the air duct 286 from opposite sides of the air duct.

Figure 30:
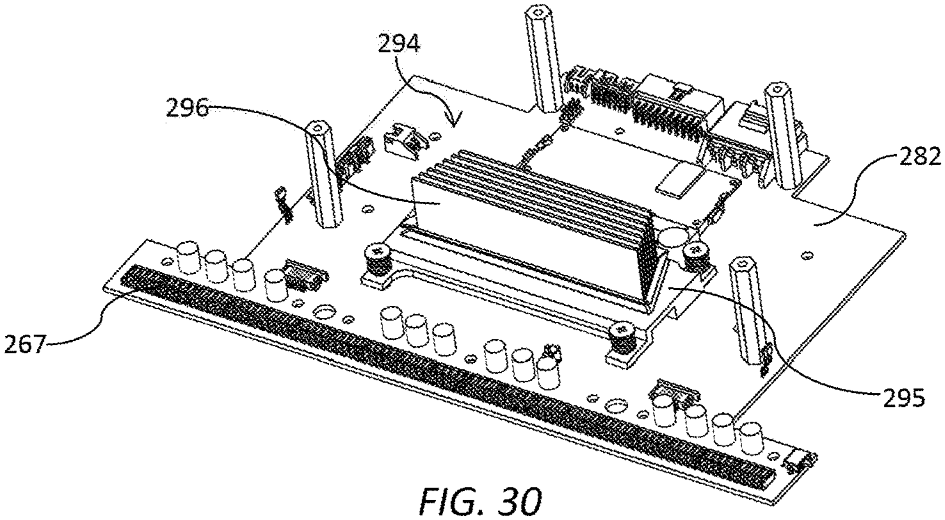
FIG. 30 is a perspective of the second PCB.
Figure 31:
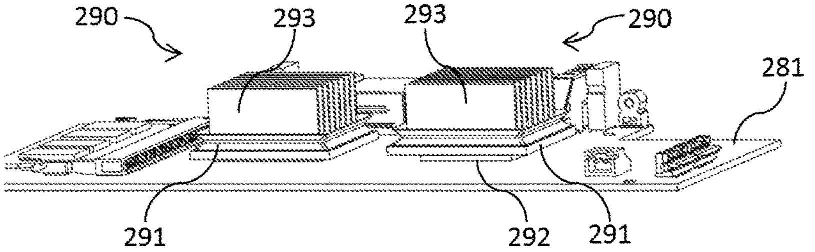
FIG. 31 is a perspective of the first PCB.

As shown in FIG. 31, the first PCB 281 has a pair of first heatsinks 290, each comprising a first base 291 in thermal contact with a respective microprocessor 292 and first cooling fins 293 extending away from the first base. Similarly, and as shown in FIG. 30, the second PCB 282 has a second heatsink 294 comprising a second base 295 in thermal contact with drive FETs (not shown) and second cooling fins 296 extending away from the second base.

The first and second cooling fins 293 and 296 are received in respective apertures defined in sidewalls of the air duct 286. FIG. 29 shows a pair of first apertures 297 defined in one side of the air duct 286 for receiving the cooling fins 293 of the pair of first heatsinks 290. From FIG. 28, it can be seen that the cooling fins 296 of the second heatsink 294 are received in a corresponding second aperture defined in an opposite side of the air duct 286.

Figure 28:
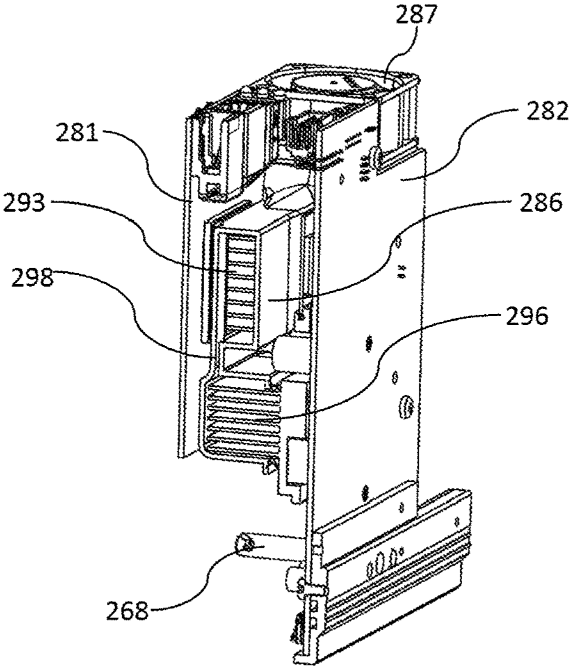
FIG. 28 is a perspective sectional view of the PCB arrangement shown in FIG. 26.
Figure 29:
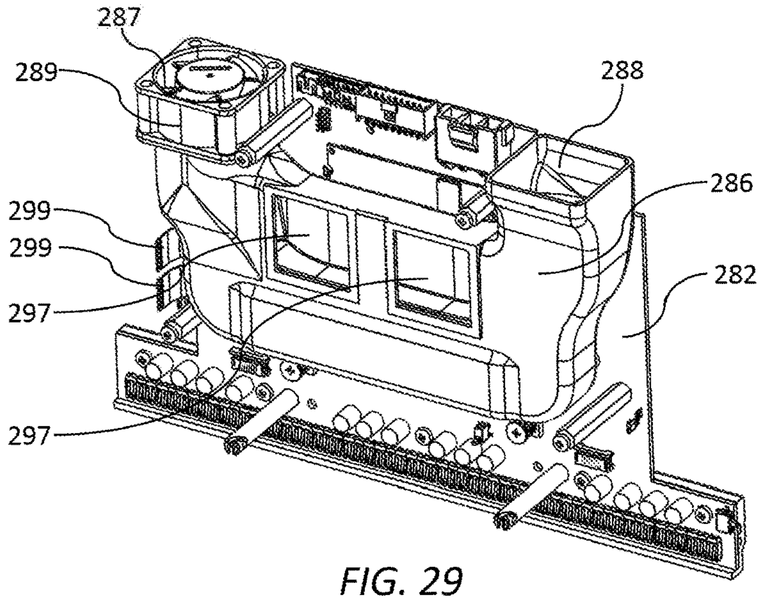
FIG. 29 is a perspective an air duct and a second PCB.

Still referring to FIG. 28, the air duct 286 has a constriction 298, which divides the air duct into separate cavities accommodating the first and second cooling fins 293 and 296. The constriction 298 serves to divide the airflow from the air inlet 287, such that the first cooling fins 293 and the second cooling fins 296 both receive the cool airflow approximately equally. This avoids, for example, the second cooling fins 296 preferentially receiving cool air and passing warm air onto the first set of cooling fins 293.

By sharing the airflow through the air duct 286 between cooling fins extending from opposed PCBs, there is provided a compact self-contained print module 215, which can be arranged in multiple arrays across a pagewidth in a relatively narrow print zone.

It will, of course, be appreciated that the present invention has been described by way of example only and that modifications of detail may be made within the scope of the invention, which is defined in the accompanying claims.

The invention claimed is:

1. A printer comprising:

a media support defining a media feed path; and a pagewide printing unit for printing onto media fed along the media feed path, the printing unit comprising:

a maintenance chassis fixedly positioned over the media feed path, the maintenance chassis having a maintenance module fixedly mounted thereto;

a print bar chassis movably mounted on the maintenance chassis, the print bar chassis comprising a print module including a printhead having opposite longitudinal sides; and a lift mechanism for raising and lowering the print bar chassis relative to the maintenance chassis between a maintenance position a printing position, wherein:

the maintenance module comprises a fixed frame defining a space through which the printhead extends and retracts in the printing and maintenance positions respectively;

the fixed frame houses one or more movable maintenance components; and the fixed frame extends alongside only one of the longitudinal sides of the printhead.

2. The printer of claim 1, wherein the print bar chassis comprises a plurality of print modules in a staggered overlapping arrangement across a width of the media path and the maintenance chassis comprises a corresponding plurality of maintenance modules, each maintenance module maintaining a respective printhead.

3. The printer of claim 1 comprising a plurality of printing units positioned along the media feed path.

4. The printer of claim 1, wherein the media feed path is generally arcuate and each print bar chassis is radially liftable with respect to the media feed path.

5. The printer of claim 1, wherein an upper portion of the maintenance chassis defines a datum for the print bar chassis in the printing position.

6. The printer of claim 1, wherein the frame is L-shaped having a longer leg and a shorter leg, and wherein the space is defined by a space partially encompassed by the longer and shorter legs.

7. The printer of claim 6, wherein each maintenance module comprises at least one of: a wiper and a capper.

8. The printer of claim 7, wherein the capper is configured to move laterally with respect to the printhead and parallel with a media feed direction.

9. The printer of claim 7, wherein the wiper is configured to move longitudinally with respect to the printhead and perpendicular to a media feed direction.

10. The printer of claim 9, wherein wipers of neighboring printheads are configured to move in opposite longitudinal directions.

11. The printer of claim 1, wherein each print module is slidably received in a sleeve fixed to the print bar chassis.

12. The printer of claim 1, wherein each print module comprises a supply module and a replaceable printhead cartridge, the printhead cartridge comprising the printhead.

13. The printer of claim 12, wherein the supply module houses at least one PCB having a printer controller chip for controlling a respective printhead.

14. The printer of claim 12, wherein the supply module comprises an ink inlet module and an ink outlet module for supplying ink to and receiving ink from the printhead cartridge.

15. A method of maintaining a printhead comprising the steps of:

providing a maintenance chassis positioned over a media feed path in a fixed relationship relative to a media support, the maintenance chassis comprising a maintenance module;

providing a print bar chassis movably mounted on the maintenance chassis, the print bar chassis comprising a print module having the printhead;

lifting the print bar chassis relative to the maintenance chassis, such that the printhead is retracted at least partially from a space defined by the maintenance module; and moving a capper or a wiper of the maintenance module into alignment with the printhead, wherein:

the maintenance module comprises a fixed frame defining a space through which the printhead extends and retracts in the printing and maintenance positions respectively; and the printhead has opposite longitudinal sides and the fixed frame extends alongside only one of the longitudinal sides of the printhead.

16. The method of claim 15, further comprising the step of lowering the print bar chassis such that the printhead engages with the capper or the wiper.

17. A pagewide printing unit for mounting over a media feed path and printing onto media, the printing unit comprising:

a maintenance chassis for fixedly mounting over the media feed path, the maintenance chassis having a maintenance module fixedly mounted thereto;

a print bar chassis movably mounted on the maintenance chassis, the print bar chassis comprising a print module including a printhead having opposite longitudinal sides; and a lift mechanism for raising and lowering the print bar chassis relative to the maintenance chassis between a maintenance position a printing position, wherein:

the maintenance module comprises a fixed frame defining a space through which the printhead extends and retracts in the printing and maintenance positions respectively;

the fixed frame houses one or more movable maintenance components; and the fixed frame extends alongside only one of the longitudinal sides of the printhead.

18. The printing unit of claim 17, wherein a footprint of the printing unit in both the printing and maintenance positions is defined by a perimeter of the maintenance chassis.

* * * * *